United States Patent
Uemura et al.

(10) Patent No.: US 8,471,288 B2
(45) Date of Patent: Jun. 25, 2013

(54) GROUP III NITRIDE SEMICONDUCTOR LIGHT-EMITTING DEVICE INCLUDING AN AUXILIARY ELECTRODE IN CONTACT WITH A BACK SURFACE OF AN N-TYPE LAYER

(75) Inventors: Toshiya Uemura, Kiyosu (JP); Jun Ito, Kiyosu (JP)

(73) Assignee: Toyoda Gosei Co., Ltd., Kiyoshu-Shi, Aichi-Ken (JP)

( * ) Notice: Subject to any disclaimer, the term of this patent is extended or adjusted under 35 U.S.C. 154(b) by 30 days.

(21) Appl. No.: 12/923,318

(22) Filed: Sep. 14, 2010

(65) Prior Publication Data
US 2011/0062488 A1    Mar. 17, 2011

(30) Foreign Application Priority Data

Sep. 15, 2009  (JP) .................. 2009-213092
Mar. 19, 2010  (JP) .................. 2010-064026
Mar. 31, 2010  (JP) .................. 2010-080462

(51) Int. Cl.
*H01L 33/00*    (2010.01)

(52) U.S. Cl.
USPC ............. 257/99; 257/94; 257/95; 257/96; 257/97; 257/103; 257/E33.062; 257/E33.063; 257/E33.065; 257/E33.066

(58) Field of Classification Search
USPC ........... 257/94, 95, 103, E33.062, E33.063, 257/E33.065, 96, 97, 99, E33.066
See application file for complete search history.

(56) References Cited

U.S. PATENT DOCUMENTS

| | | | | |
|---|---|---|---|---|
| 7,304,325 | B2* | 12/2007 | Uemura et al. | 257/79 |
| 7,511,311 | B2* | 3/2009 | Kususe et al. | 257/95 |
| 8,283,191 | B2* | 10/2012 | Rode et al. | 438/29 |
| 2010/0171135 | A1 | 7/2010 | Engl et al. | |
| 2011/0049555 | A1 | 3/2011 | Engl et al. | |

FOREIGN PATENT DOCUMENTS

| | | |
|---|---|---|
| JP | 2006-148087 A | 6/2006 |
| JP | 2008-171941 A | 7/2008 |
| JP | 2008-205005 A | 9/2008 |
| JP | 2009-176966 A | 8/2009 |
| WO | WO 2008/131735 A1 | 11/2008 |
| WO | WO 2009/121319 A1 | 10/2009 |

OTHER PUBLICATIONS

Japanese Office Action dated Jul. 31, 2012 with a partial English translation thereof.
Japanese Office Action dated Mar. 12, 2013 with a partial English translation thereof.
Chinese Office Action dated Mar. 25, 2013 with an English translation thereof.

* cited by examiner

*Primary Examiner* — Jay C Kim
(74) *Attorney, Agent, or Firm* — McGinn IP Law Group, PLLC

(57) ABSTRACT

A Group III nitride semiconductor light-emitting device includes a support, a p-electrode provided on the support, a p-type layer including a Group III nitride semiconductor and provided on the p-electrode, an active layer including a Group III nitride semiconductor and provided on the p-type layer, an n-type layer including a Group III nitride semiconductor and provided on the active layer, an n-electrode which is connected to the n-type layer, a first trench having a depth extending from a back surface of the p-type layer on a side of the p-electrode to reach the n-type layer, an auxiliary electrode which is in contact with a back surface of the n-type layer at a bottom of the first trench, but is not in contact with side walls of the first trench, and an insulating film which exhibits light permeability.

18 Claims, 20 Drawing Sheets

GROUP III NITRIDE SEMICONDUCTOR LIGHT-EMITTING DEVICE INCLUDING AN AUXILIARY ELECTRODE IN CONTACT WITH A BACK SURFACE OF AN N-TYPE LAYER

BACKGROUND OF THE INVENTION

1. Field of the Invention

The present invention relates to a Group III nitride semiconductor light-emitting device including an epitaxially grown layer which has been removed from a growth substrate through the lift-off process and is bonded to a support. The present invention also relates to a light-emitting device including a support formed of a ceramic substrate.

2. Background Art

In general, a sapphire substrate has been used as a growth substrate for a Group III nitride semiconductor. However, sapphire poses problems in terms of electrical conductivity and thermal conductivity. For example, a Group III nitride semiconductor light-emitting device having a device structure formed on a sapphire substrate exhibits poor linearity in a high-current region or poor durability upon long-term operation. Sapphire has no cleavage property and exhibits high physical and chemical strength. Therefore, when a light-emitting device is produced from a sapphire substrate, separation of the device into chips requires an intricate process (e.g., a process of thinning the sapphire substrate), which causes an increase in production cost. Another cause of high production cost is that a sapphire substrate itself is expensive.

In order to solve such problems, attempts have been made to develop a technique in which a Group III nitride semiconductor is grown on a growth substrate, and subsequently the growth substrate is removed therefrom (i.e., substrate lift-off process).

One such technique is the laser lift-off process. In this process, after bonding of a Group III nitride semiconductor layer to a support substrate, the interface between a growth substrate and the Group III nitride semiconductor layer is irradiated with a laser beam, to thereby decompose the Group III nitride semiconductor layer for separation and removal of the growth substrate. Meanwhile, a so-called chemical lift-off process has been developed as a technique for removal of a growth substrate. In this process, a chemical-soluble layer is incorporated into a Group III nitride semiconductor layered structure as a layer that is nearest to a growth substrate, and, after bonding of the Group III nitride semiconductor layered structure to a support substrate, the chemical-soluble layer is dissolved by a specific chemical, to thereby remove the growth substrate.

Japanese Patent Application Laid-Open (kokai) No. 2008-205005 discloses a technique for improving the light extraction performance of a Group III nitride semiconductor light-emitting device from which a growth substrate has been removed and which is bonded to a support substrate. In the light-emitting device described in Japanese Patent Application Laid-Open (kokai) No. 2008-205005, a dent for light reflection is provided so as to extend from the surface of a p-type layer (on the side where the p-type layer is bonded to a p-electrode) to an n-type layer, and side walls of the dent are inclined such that the area of a horizontal cross section of the dent parallel to the main surface of the device is reduced with decreasing distance between the cross section and the n-type layer. By means of this dent for light reflection, light which is confined in the vicinity of an active layer and is propagated in directions parallel to the main surface of the device is reflected onto the side of the n-type layer, whereby light extraction performance is improved.

Japanese Patent Application Laid-Open (kokai) No. 2009-176966 discloses a semiconductor device produced through the laser lift-off process, which includes a support substrate formed by providing electrode layers on both surfaces of an AlN or SiC ceramic substrate, and electrically connecting the electrode layers by means of vias. This patent document proposes employment of such a support substrate for solving a problem in terms of thermal conductivity and for achieving electrical conduction in a direction perpendicular to the main surface of the substrate. This patent document also proposes employment, as a growth substrate for a Group III nitride semiconductor, of an Si substrate which has a large size and is less expensive than a sapphire substrate.

However, even when a dent for light reflection is provided as described in Japanese Patent Application Laid-Open (kokai) No. 2008-205005, a portion of light reflected by the dent onto the side of an n-type layer is reflected onto the surface of the n-type layer (on the side where the n-type layer is bonded to an n-electrode) and returns to the interior of the device. Thus, light extraction performance fails to be improved sufficiently.

Conceivably, light extraction performance may be improved by reducing the area of the n-electrode formed on the surface of the n-type layer. However, in such a case, current is not diffused sufficiently in directions parallel to the main surface of the device, and uniformity of emitted light is impaired. In addition, light emission performance is considerably reduced upon operation at high current density.

The method described in Japanese Patent Application Laid-Open (kokai) No. 2009-176966 can solve a problem in terms of processability and thermal conductivity of a sapphire substrate. However, this method cannot solve a problem in terms of an increase in production cost, since a sapphire substrate is generally used as a growth substrate. In addition, when a ceramic substrate is used as a support substrate as described in Japanese Patent Application Laid-Open (kokai) No. 2009-176966, the ceramic substrate must be processed so that electrical conduction is achieved in a thickness direction, and thus production cost increases with increasing number of production processes. Other causes of an increase in production cost are that the laser lift-off apparatus employed is expensive, and production yield is low.

meanwhile, a Group III nitride semiconductor light-emitting device having a device structure formed on an Si substrate realizes reduction in production cost, since the device does not employ an expensive sapphire substrate. However, such a light-emitting device poses a problem in that light extraction performance is low due to absorption of light by the Si substrate.

SUMMARY OF THE INVENTION

In view of the foregoing, an object of the present invention is to provide a Group III nitride semiconductor light-emitting device exhibiting improved light extraction performance without impairing uniformity of emitted light.

Another object of the present invention is to realize a Group III nitride semiconductor light-emitting device exhibiting high light extraction performance at low cost.

In a first aspect of the present invention, there is provided a Group III nitride semiconductor light-emitting device comprising an electrically conductive support; a p-electrode provided on the support; a p-type layer formed of a Group III nitride semiconductor and provided on the p-electrode; an active layer formed of a Group III nitride semiconductor and provided on the p-type layer; an n-type layer formed of a Group III nitride semiconductor and provided on the active layer; an n-electrode which is connected to the n-type layer; a first trench having a depth extending from the surface of the p-type layer on the p-electrode's side to reach the n-type layer; an auxiliary electrode which is in contact with the surface of the n-type layer serving as the bottom of the first trench, but is not in contact with side walls of the first trench; and an insulating film which exhibits light permeability and is provided so as to cover the auxiliary electrode and the bottom and side walls of the first trench.

The n-electrode may be formed on the surface of the n-type layer opposite the surface which is bonded to the p-type layer, or may be bonded to the auxiliary electrode when the auxiliary electrode is exposed through removal of the n-type layer, the active layer, and the p-type layer.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (Group 3B element) (i.e., B or Tl), or a portion of N is substituted by another Group 15 element (Group 5B element) (i.e., P, As, Sb, or Bi). Specific examples of the Group III nitride semiconductor include those containing at least Ga, such as GaN, InGaN, AlGaN, and AlGaInN. Generally, Si is employed as an n-type impurity, and Mg is employed as a p-type impurity.

A second aspect of the present invention is drawn to a specific embodiment of the Group III nitride semiconductor light-emitting device according to the first aspect, wherein the n-electrode is formed on the n-type layer, and a portion or the entirety of the n-electrode is provided so as to face at least a portion of the auxiliary electrode.

A third aspect of the present invention is drawn to a specific embodiment of the Group III nitride semiconductor light-emitting device, wherein the device further comprises a second trench which is provided in a region facing a portion of the auxiliary electrode in a direction perpendicular to the main surface of the device, and which has a depth extending from the surface of the n-type layer on the side opposite the side of the p-electrode to the auxiliary electrode; and the n-electrode is formed of only a pad portion and is provided on a portion of the auxiliary electrode exposed through the second trench.

A fourth aspect of the present invention is drawn to a specific embodiment of the Group III nitride semiconductor light-emitting device according to the first aspect, wherein the support is formed of a ceramic substrate, and the device further comprises a third trench which is provided in a region not facing the auxiliary electrode in a direction perpendicular to the main surface of the device, and which has a depth extending from the surface of the n-type layer on the side opposite the side of the p-electrode to the p-electrode; and a p-pad electrode which is provided on a portion of the p-electrode exposed through the third trench.

A fifth aspect of the present invention is drawn to a specific embodiment of the Group III nitride semiconductor light-emitting device according to the third aspect, wherein the support is formed of a ceramic substrate, and the device further comprises a third trench which is provided in a region not facing the auxiliary electrode in a direction perpendicular to the main surface of the device, and which has a depth extending from the surface of the n-type layer on the side opposite the side of the p-electrode to the p-electrode; and a p-pad electrode which is provided on a portion of the p-electrode exposed through the third trench.

In the second or fourth aspect, the n-electrode may be formed of only a circular or rectangular pad portion, or may be formed of a pad portion and a wiring portion. The n-electrode may have any pattern. However, from the viewpoint of improving uniformity of emitted light, preferably, the n-electrode has a symmetrical pattern; for example, a pattern in which wiring portions radially extend from a pad portion provided at the center, or a pattern in which two pad portions are provided at vertices of a rectangular wiring portion.

When the n-electrode is formed of only a pad portion (third aspect), or when the n-pad electrode or the p-pad electrode is formed of only a pad portion (fourth or fifth aspect), the pad electrode may have any form; for example, a circular or square form.

In the third to fifth aspects, no particular limitation is imposed on the number of pad portions. However, from the viewpoint of current diffusion, preferably, a pad portion(s) is (are) provided so as to be symmetrical with respect to the form of the device. For example, one pad portion may be provided at the center of the device. Alternatively, when the device has a rectangular form, two pad portions may be provided at diagonal positions of the rectangular device. Preferably, the n-pad electrode is in contact with the auxiliary electrode over the largest possible area, and, as viewed from above, the n-pad electrode is encompassed by the auxiliary electrode. This is because such an arrangement facilitates electrical conduction between the auxiliary electrode and the n-pad electrode.

The aforementioned first to fifth aspects will be further described below.

The first trench or the auxiliary electrode may have any pattern. However, from the viewpoint of improving uniformity of emitted light, preferably, the first trench or the auxiliary electrode has a symmetrical wiring pattern; for example, a grid-like, stripe-like, or radial wiring pattern, or a combination of such wiring patterns. The pattern of the first trench may be identical to or different from that of the auxiliary electrode. The pattern of the auxiliary electrode may be a portion of the pattern of the trench.

When the n-electrode is formed on the n-type layer, preferably, the auxiliary electrode has such a pattern that a portion of the auxiliary electrode faces a portion or the entirety of the n-electrode in a direction perpendicular to the main surface of the device, and these electrodes face in a largest possible region. This is because, electrical conduction is readily achieved between the auxiliary electrode and the n-electrode, and current is more readily diffused by the auxiliary electrode in directions parallel to the main surface of the device. Since light emitted from the active layer provided directly below the n-electrode is shielded by the n-electrode, formation of the trench or the auxiliary electrode in a region facing the n-electrode is advantageous for reduction in light emission loss.

Now will be described both the case where the n-electrode is formed on the n-type layer, and the case where the n-electrode is formed on the auxiliary electrode.

Preferably, a portion of the auxiliary electrode having the same area and form as those of the pad portion of the n-electrode is provided so as to face the pad portion in a direction perpendicular to the main surface of the device. Preferably, a portion of the first trench or the auxiliary electrode has a wiring pattern which surrounds the periphery of a light emission region. As used herein, "light emission region" refers to a region where light is emitted upon application of voltage to the light-emitting device; specifically, the light emission region almost corresponds to a region in which the active layer overlaps with the p-electrode. When the first trench or the auxiliary electrode has such a pattern, light which has been conventionally emitted from the side surfaces of the device can be reflected onto the side of the n-type layer by means of the side walls of the first trench. Therefore, the amount of light emitted from the side surfaces of the device is reduced, and the amount of light emitted from the top surface of the device is increased. Thus, in general, light emitted from the side surfaces of the device is not effectively utilized by a conventional structure. However, in the present invention, light emitted in a lateral direction is effectively utilized, whereby light extraction performance can be substantially enhanced. The first trench may also serve as a trench for device isolation formed at the periphery of the device.

The auxiliary electrode preferably has an area greater than that of the n-electrode. This is because when the area of the n-electrode is reduced and the area of the auxiliary electrode is increased, light extraction performance can be improved while uniformity of emitted light is maintained. Particularly preferably, the area of the n-electrode is adjusted to 1 to 10% that of the device, and the area of the auxiliary electrode is adjusted to 4 to 16% that of the device, from the viewpoint of further improvement of light extraction performance.

The n-electrode may partially communicate with the auxiliary electrode by means of, for example, a structure in which a portion of the first trench penetrates the n-type layer. However, it is not preferred that such communication is provided over a large area. This is because such large-area communication reduces the area of a region where the auxiliary electrode is in contact with the +c-plane surface of the n-type layer of Group III nitride semiconductor, and lowers the effect of diffusing current in directions parallel to the main surface of the device.

The side walls of the first trench are preferably inclined such that the area of a horizontal cross section of the first trench parallel to the main surface of the device is reduced with decreasing distance between the cross section and the n-type layer. This is because light propagating in directions parallel to the main surface of the device can be reflected onto the side of the n-type layer by means of the side walls of the first trench, whereby light extraction performance can be further improved. The side walls of the first trench are preferably inclined by 30 to 85° with respect to the main surface of the device. This is because when the angle between the side walls and the main surface of the device is less than 30° or exceeds 85°, light extraction performance may fail to be improved sufficiently. The angle is more preferably 40 to 80°.

The auxiliary electrode may be formed of any material which has been conventionally known as a material of the n-electrode that is in contact with the +c-plane surface (Ga-polar surface) of the n-type layer of Group III nitride semiconductor. For example, the auxiliary electrode may be formed of a material such as V/Al, Ti/Al, V/Au, Ti/Au, or Ni/Au. The material of the n-electrode may be the same as that of the auxiliary electrode, or may be another material which can maintain good contact with the –c-plane surface (N-polar surface) of the n-type layer of Group III nitride semiconductor.

When the n-pad electrode is bonded directly to the auxiliary electrode, the n-pad electrode may be formed of any electrically conductive material. The material of the n-pad electrode may be the same as that of the auxiliary electrode. Particularly preferably, the n-pad electrode is formed of two or more layers, and the layer (among the two or more layers) which is in contact with the auxiliary electrode is formed of a nitrogen-reactive material. In this case, strong adhesion is achieved between the n-pad electrode and the auxiliary electrode. Examples of the nitrogen-reactive material include Ti, V, Zr, W, Ta, and Cr.

Since the p-pad electrode is bonded directly to the p-electrode, the p-pad electrode may be formed of any electrically conductive material. Particularly preferably, the p-pad electrode is formed of the same material as the n-pad electrode. In this case, the n-pad electrode and the p-pad electrode can be formed simultaneously, and thus cost required for production of the Group III nitride semiconductor light-emitting device can be further reduced.

Preferably, the surface of the n-type layer is treated through wet etching by use of an aqueous solution of, for example, KOH, NaOH, TMAH (tetramethylammonium hydroxide), or phosphoric acid, so as to form minute dents on the surface for improving light extraction performance. When the n-electrode is formed on the surface of the n-type layer, preferably, a region on which the n-electrode is formed remains flat without forming such minute dents thereon, for the purpose of preventing deterioration of light extraction performance due to multiple reflection and attenuation of light between the n-electrode and the minute dents. A structure having minute dents having a size on the order of, or smaller than, the wavelength of emission may be formed on the surface of the n-type layer through dry etching after formation of a micro mask pattern.

The insulating film is provided for preventing leakage of current or short circuit. The insulating film may be formed of any material exhibiting insulating property and permeability to light emitted from the light-emitting device; for example, $SiO_2$, $Al_2O_3$, $Si_3N_4$, or $TiO_2$. Preferably, a highly reflective layer is provided, via the insulating film, on the side walls or bottom of the first trench. The highly reflective layer may be a p-electrode formed of a highly reflective material. A dielectric multi-layer film may be provided, via the insulating film, on the side walls or bottom of the first trench, or the insulating film itself may be formed of a dielectric multi-layer film, so as to enhance reflectance.

The growth substrate for a Group III nitride semiconductor is generally formed of sapphire, but may be formed of, for example, SiC, ZnO, or spinel. The support may be formed of a substrate of, for example, Si, Ge, GaAs, Cu, or Cu—W. The p-electrode may be formed on the support by bonding the p-electrode to the support via a metal layer. The metal layer may be a eutectic metal layer such as an Au—Sn layer, an Au—Si layer, an Ag—Sn—Cu layer, or an Sn—Bi layer, or may be formed of, for example, an Au layer, an Sn layer, or a Cu layer. A metal layer (e.g., Cu layer) may be formed directly on the p-electrode through, for example, plating or sputtering, and the metal layer may be employed as a support.

The p-electrode may be bonded to a ceramic substrate via a low-melting-point metal layer. The low-melting-point metal layer may be a eutectic metal layer such as an Au—Sn layer, an Au—Si layer, an Ag—Sn—Cu layer, or an Sn—Bi layer. The low-melting-point metal layer may be, for example, an Au layer, an Sn layer, or a Cu layer, although such a metal does not exhibit low melting point.

A sixth aspect of the present invention is drawn to a specific embodiment of the Group III nitride semiconductor light-emitting device, wherein the area of the auxiliary electrode is greater than that of the n-electrode.

A seventh aspect of the present invention is drawn to a specific embodiment of the Group III nitride semiconductor light-emitting device, wherein the first trench or the auxiliary electrode has a wiring pattern.

An eighth aspect of the present invention is drawn to a specific embodiment of the Group III nitride semiconductor light-emitting device, wherein the side walls of the first trench are inclined such that the area of a horizontal cross section of the first trench parallel to the main surface of the device is reduced with decreasing distance between the cross section and the n-type layer.

A ninth aspect of the present invention is drawn to a specific embodiment of the Group III nitride semiconductor light-emitting device, wherein a portion of the first trench or the auxiliary electrode has a wiring pattern which surrounds the periphery of a light emission region.

A tenth aspect of the present invention is drawn to a specific embodiment of the Group III nitride semiconductor light-emitting device, wherein the auxiliary electrode is formed of V/Al, Ti/Al, V/Au, Ti/Au, or Ni/Au.

An eleventh aspect of the present invention is drawn to a specific embodiment of the Group III nitride semiconductor light-emitting device, wherein, as viewed from above, the auxiliary electrode encompasses the n-electrode.

A twelfth aspect of the present invention is drawn to a specific embodiment of the Group III nitride semiconductor light-emitting device according to the third or fifth aspect, wherein the Group III nitride semiconductor light-emitting device has a rectangular form, and the n-electrode is formed of two pad portions provided at diagonal positions of the rectangular device.

A thirteenth aspect of the present invention is drawn to a specific embodiment of the Group III nitride semiconductor light-emitting device according to the fourth or fifth aspect, wherein the Group III nitride semiconductor light-emitting device has a rectangular form, and the p-pad electrode are disposed at diagonal positions of the rectangular device.

A fourteenth aspect of the present invention is drawn to a specific embodiment of the Group III nitride semiconductor light-emitting device according to the fifth aspect, wherein the n-electrode and the p-pad electrode are disposed at diagonal positions of the rectangular device.

A fifteenth aspect of the present invention is drawn to a specific embodiment of the Group III nitride semiconductor light-emitting device according to the third or fifth aspect, wherein the n-electrode is formed of one pad portion provided in a center region of the device.

A sixteenth aspect of the present invention is drawn to a specific embodiment of the Group III nitride semiconductor light-emitting device according to the fourth or fifth aspect, wherein the ceramic substrate is formed of AlN or SiC.

In the first aspect, the auxiliary electrode, which electrically conducts with the n-electrode, is provided for aiding diffusion of current in directions parallel to the main surface of the device. Since the auxiliary electrode is in contact with the +c-plane surface of the n-type layer of Group III nitride semiconductor (i.e., the bottom of the first trench), low contact resistance is achieved. Therefore, current is effectively diffused in directions parallel to the main surface of the device by means of the auxiliary electrode, whereby uniformity of emitted light can be improved. Thus, since the n-electrode is less required to diffuse current in directions parallel to the main surface of the device, the area of the n-electrode can be reduced, whereby inhibition of light extraction by the n-electrode is suppressed, and light extraction performance can be improved.

According to the second aspect, since electrical conduction between the n-electrode and the auxiliary electrode is readily achieved, and current is effectively diffused in directions parallel to the main surface of the device, uniformity of emitted light can be further improved.

According to the third aspect, the auxiliary electrode, which electrically conducts with the n-electrode, is provided for aiding diffusion of current in directions parallel to the main surface of the device, and the n-electrode communicates with the auxiliary electrode. Since the auxiliary electrode is in contact with the +c-plane surface of the n-type layer of Group III nitride semiconductor exposed through the bottom of the trench, low contact resistance is achieved. Therefore, current is effectively diffused in directions parallel to the main surface of the device by means of the auxiliary electrode, whereby uniformity of emitted light can be improved. Since the n-electrode is formed of only a pad portion and is not located above a light emission region, light extraction is not inhibited by the n-electrode, and thus light extraction performance can be improved. A voltage drop decided by the sheet resistance of the n-type layer is considerably suppressed, and therefore driving voltage can be reduced.

According to the fourth or fifth aspect, the support is formed of a ceramic substrate, and the n-pad electrode and the p-pad electrode are provided on the Group III nitride semiconductor layers on the side opposite the side of the ceramic substrate. Therefore, unlike the case of the semiconductor device described in Japanese Patent Application Laid-Open (kokai) No. 2009-176966, processing of the ceramic substrate is not required for achieving electrical conduction in a thickness direction, and thus production cost can be reduced. In addition, current can be effectively diffused in directions parallel to the main surface of the device by means of the auxiliary electrode, and thus uniformity of emitted light can be improved. Since the n-electrode can be formed of only a pad portion by virtue of provision of the auxiliary electrode, and the n-pad electrode is not located above a light emission region, light extraction is not inhibited by the n-pad electrode, and thus light extraction performance can be improved.

According to the sixth aspect, inhibition of light extraction by the n-electrode can be further reduced without impairing uniformity of emitted light; i.e., light extraction performance can be further improved.

According to the seventh aspect, current is effectively diffused in directions parallel to the main surface of the device by means of the auxiliary electrode, and thus uniformity of emitted light can be further improved.

According to the eighth aspect, light confined in the device can be reflected upward by means of the side walls of the first trench, and light extraction performance can be improved.

According to the ninth aspect, the amount of light emitted from the side surfaces of the device is reduced, and the amount of light emitted from the top surface of the device is increased. Therefore, light extraction performance can be substantially enhanced.

According to the tenth aspect, the auxiliary electrode can be formed of V/Al, Ti/Al, V/Au, Ti/Au, or Ni/Au.

According to the eleventh aspect, since the n-electrode is in contact with the auxiliary electrode in a large area, electrical conduction is readily achieved between the auxiliary electrode and the n-electrode, and thus the area of the n-electrode can be reduced. Therefore, light emission region can be enlarged, and light output can be improved.

According to the twelfth to fifteenth aspect, since a pad portion(s) of the n-electrodes is (are) provided in a symmetrical manner, current is more effectively diffused in directions parallel to the main surface of the device, and uniformity of emitted light can be further improved.

According to the sixteenth aspect, the ceramic substrate can be formed of AlN or SiC, which exhibits high thermal conductivity and has a thermal expansion coefficient nearly equal to that of a Group III nitride semiconductor, and thus heat is effectively radiated to the outside of the device. Therefore, linearity in a high-current region and durability upon long-term operation can be improved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
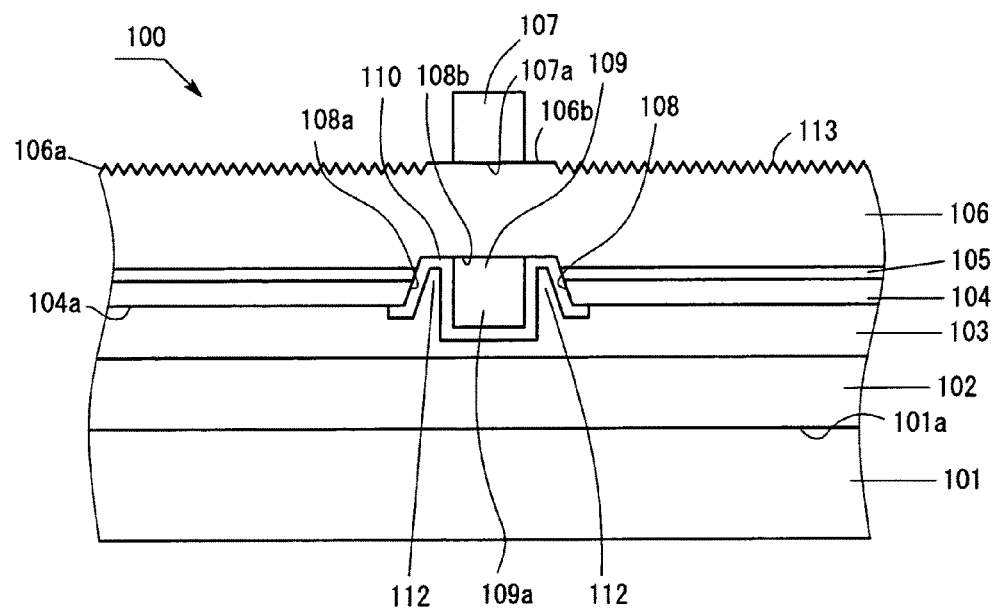
FIG. 1 shows the structure of a light-emitting device 100 according to Embodiment 1.
Figure 2:
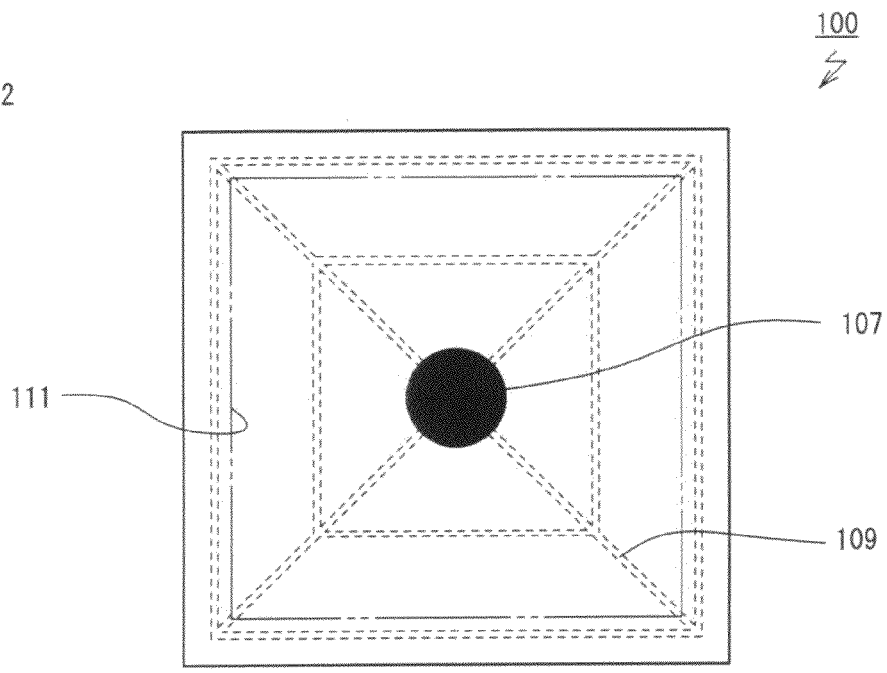
FIG. 2 shows a pattern of an n-electrode.

FIG. 1 is a cross-sectional view of the structure of a light-emitting device 100 according to Embodiment 1, and FIG. 2 is a top view of the light-emitting device 100. As shown in FIG. 2, the light-emitting device 100 has a square form as viewed from above. As shown in FIG. 1, the light-emitting device 100 includes a support 101; a low-melting-point metal layer 102 formed on the support 101; a p-electrode 103 bonded to the support 101 via the low-melting-point metal layer 102; a p-type layer 104, an active layer 105, and an n-type layer 106, which are formed of a Group III nitride semiconductor and sequentially stacked on the p-electrode 103; and an n-electrode 107 formed on the n-type layer 106.

The support 101 may be an electrically conductive substrate formed of, for example, Si, GaAs, Cu, or Cu—W. The low-melting-point metal layer 102 may be a eutectic metal layer such as an Au—Sn layer, an Au—Si layer, an Ag—Sn—Cu layer, or an Sn—Bi layer. Alternatively, the low-melting-point metal layer 102 may be, for example, an Au layer, an Sn layer, or a Cu layer, although such a metal does not have low melting point. Instead of bonding the p-electrode 103 to the support 101 via the low-melting-point metal layer 102, a metal layer (e.g., Cu layer) may be formed directly on the p-electrode 103 through, for example, plating or sputtering, and the metal layer may be employed as the support 101. The p-electrode 103 is formed of a metal exhibiting high optical reflectance and low contact resistance, such as Ag, Rh, Pt, Ru, or an alloy predominantly containing such a metal. Alternatively, the p-electrode 103 may be formed of, for example, Ni, an Ni alloy, or an Au alloy, or may be formed of a composite layer including a transparent electrode film (e.g., ITO film) and a high-reflectance metal film.

Each of the p-type layer 104, the active layer 105, and the n-type layer 106 may have any of conventionally known structures for light-emitting devices. The p-type layer 104 may have, for example, a structure in which a GaN p-contact layer doped with Mg and an AlGaN p-cladding layer doped with Mg are sequentially stacked on the support 101. The active layer 105 may have, for example, an MQW structure in which GaN barrier layers and InGaN well layers are alternately stacked. The n-type layer 106 may have, for example, a structure in which a GaN n-cladding layer and a GaN n-type contact layer doped with Si at high concentration are sequentially stacked on the active layer 105.

A first trench 108 is formed on a surface 104a of the p-type layer 104, said surface 104a being more closer to the p-electrode 103. The first trench 108 penetrates the p-type layer 104 and the active layer 105, and has a depth reaching the n-type layer 106. The side walls 108a of the first trench 108 are inclined such that the area of a horizontal cross section of the trench in directions parallel to the main surface 101a of the device 100 is reduced with decreasing distance between the cross section and the n-type layer 106. The bottom 108b of the first trench 108 is parallel to the main surface 101a of the device 100.

Preferably, the side walls 108a of the first trench 108 are inclined by 30 to 85° (more preferably 40 to 80°) with respect to the main surface 101a of the device 100. This is because, when the angle between the side walls 108a and the main surface 101a of the device 100 falls within the above range, light extraction performance can be further improved.

The n-type layer 106 is exposed through the bottom 108b of the first trench 108, and an auxiliary electrode 109 is formed such that it is in contact with the bottom 108b of the first trench 108 (through which the n-type layer 106 is exposed), but is not in contact with the side walls 108a of the first trench 108. An SiO$_2$ insulating film 110 is continuously formed on the side walls 108a of the first trench 108, on a portion of the bottom 108b of the first trench 108 on which the auxiliary electrode 109 is not formed, and on the auxiliary electrode 109. The insulating film 110 is provided for preventing short circuit between the side walls 108a of the first trench 108 and the p-electrode 103, and between the auxiliary electrode 109 and the p-type layer 104. The auxiliary electrode 109 may be formed of any material which has been conventionally used as a material of the n-electrode that is in contact with the +c-plane surface of the n-type layer of Group III nitride semiconductor. For example, the auxiliary electrode 109 may be formed of a material such as V/Al, V/Au, Ti/Au, or Ni/Au.

No particular limitation is imposed on the material of the insulating film 110, so long as the material exhibits insulating property and transparency to light emitted from the light-emitting device 100. Examples of the material include, in addition to $SiO_2$, $Al_2O_3$, $Si_3N_4$, and $TiO_2$.

Gaps 112 provided between the side walls 108a of the first trench 108 and the auxiliary electrode 109 via the insulating film 110 are filled with the p-electrode 103 formed of a highly reflective metal so that optical reflectance is enhanced at the side walls 108a of the first trench 108, and that light is more effectively reflected onto the side of the n-type layer 106. Instead of filling the gaps 112 with the p-electrode 103, the side walls 108a of the first trench 108 may be covered, via the insulating film 110, with a highly reflective metal film or a dielectric multi-layer film formed of a plurality of dielectric materials having different refractive indices, to thereby improve light extraction performance.

As shown FIG. 2, the n-electrode 107 has only a circular pad portion provided on the center of the device 100, and does not have a wiring portion for improving diffusion of current. The n-electrode 107 may be formed of a material similar to that of the auxiliary electrode 109; i.e., any material which has been conventionally used as a material of the n-electrode that is in contact with the +c-plane surface (Ga-polar surface) of the n-type layer of Group III nitride semiconductor. However, such a material encounters difficulty in achieving sufficiently low contact resistance to the −c-plane surface (N-polar surface) of the n-type layer of Group III nitride semiconductor on which the n-electrode 107 is formed. Therefore, the n-electrode 107 may be formed of a material which can achieve lower contact resistance to the −c-plane surface of an n-type Group III nitride semiconductor.

Figure 3:
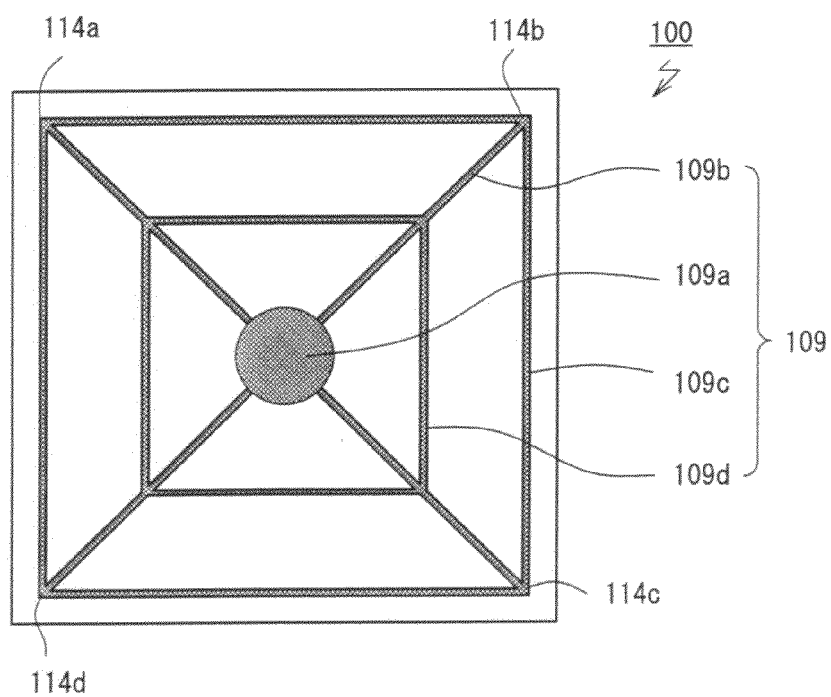
FIG. 3 shows a pattern of an auxiliary electrode.

FIG. 3 shows a pattern of the auxiliary electrode 109 as viewed from the above (hereinafter such a pattern may be referred to as a "plan-view pattern"). The first trench 108 has a plan-view pattern similar to that of the auxiliary electrode 109. Therefore, now will be described only the plan-view pattern of the auxiliary electrode 109. As shown in FIG. 3, the auxiliary electrode 109 includes a circular portion 109a which has a form and size similar to those of the n-electrode 107 and which is provided at a position facing the n-electrode 107 in a direction perpendicular to the main surface 101a of the device 100 (i.e., the portion 109a is provided at a center position of the device 100). The auxiliary electrode 109 also includes four wiring portions 109b extending from the circular portion 109a toward the vertices 114a, 114b, 114c, 114d of the square, respectively. The auxiliary electrode 109 also includes a square wiring portion 109c surrounding the periphery 111 of a light emission region of the light-emitting device 100, and a square wiring portion 109d provided inside of the wiring portion 109c. The periphery 111 of the light emission region corresponds to a square portion represented by dotted lines in FIG. 2, and the light emission region almost corresponds to a region in which the p-electrode 103 and the active layer 105 are formed.

The circular portion 109a, which forms the auxiliary electrode 109, is provided at a position facing the n-electrode 107 in a direction perpendicular to the main surface 101a of the device 100, since such a configuration realizes smoother flow of current between the n-electrode 107 and the auxiliary electrode 109. One reason for such a configuration is that formation of the first trench 108 at the facing position—at which, originally, almost no light can be extracted due to shielding by the n-electrode 107—for preventing light emission at the position is preferred from the viewpoint of improvement of light output.

The wiring portion 109c, which forms the auxiliary electrode 109, is provided so as to surround the periphery 111 of the light emission region, for the following reasons. Since the wiring portion 109c is formed on the bottom 108b of the first trench 108, naturally, a portion of the first trench 108 is also formed in a square wiring pattern so as to surround the periphery 111 of the light emission region. In the light-emitting device 100, light which has been conventionally emitted from the side surfaces of the device 100 is reflected onto the side of the n-type layer 106 by means of the side walls 108a of the first trench 108 surrounding the periphery 111 of the light emission region. Since, in general, light emitted from the side surfaces of the device 100 is not effectively utilized, the light-emitting device 100, in which emitted light is reflected onto the side of the n-type layer 106 by means of the wiring portion 109c, realizes substantial improvement of light extraction performance.

Minute dents 113 are formed on the entire surface 106a of the n-type layer 106, said surface 106a being closer to the n-electrode 107, except for a region 106b on which the n-electrode 107 is formed. The minute dents 113 are formed of numerous micro hexagonal pyramids, and side surfaces of each hexagonal pyramid are inclined by about 60° with respect to the main surface 101a of the device 100. Light extraction performance is improved by virtue of the minute dents 113. The minute dents 113 are not formed on a region 106b (on which the n-electrode 107 is formed) of a surface 106a of the n-type layer 106, said surface 106a being more closer to the n-type electrode 107, and the region 106b remains flat. This is for preventing deterioration of light extraction performance due to multiple reflection and attenuation of light between the bottom surface 107a of the n-electrode 107 and the surface of the minute dents 113.

In the light-emitting device 100, the first trench 108 is formed so as to extend from the p-type layer 104 to the n-type layer 106, and the auxiliary electrode 109 is provided on the bottom 108b of the first trench 108. The bottom 108b of the first trench 108 corresponds to the +c-plane surface of the n-type layer 106 of Group III nitride semiconductor, and the auxiliary electrode 109 can maintain sufficiently low resistance contact with the bottom 108b of the first trench 108. Therefore, electrons which are supplied from the n-electrode 107 and flow through the n-type layer 106 to the auxiliary electrode 109 can be widely diffused in directions parallel to the main surface 101a of the device 100 through the wiring-patterned auxiliary electrode 109, whereby uniformity of emitted light can be improved. Since provision of the auxiliary electrode 109 improves diffusion of current in directions parallel to the main surface 101a of the device 100, the n-electrode 107 is less required to diffuse current in directions parallel to the main surface 101a of the device 100, and thus the area of the n-electrode 107 can be reduced, as compared with the case of a conventional light-emitting device. Indeed, in the light-emitting device 100, the n-electrode 107—which is formed of only a pad portion and includes no wiring portion—has an area smaller than that in the case of a conventional light-emitting device, and the area of the n-electrode 107 is smaller than that of the auxiliary electrode 109. When the area of the n-electrode 107 is reduced, the amount of light reflected, absorbed, or shielded by the n-electrode 107 is reduced, and thus light extraction performance is improved. As described above, the light-emitting device 100 has a structure which realizes improvement of light extraction performance without impairing uniformity of emitted light.

Since the side walls 108a of the first trench 108 are inclined such that the area of a horizontal cross section of the first trench 108 parallel to the main surface 101a of the device 100 is reduced with decreasing distance between the cross section and the n-type layer 106, light propagating in directions parallel to the main surface 101a of the device 100 can be reflected onto the side of the n-type layer 106 by means of the side walls 108a of the first trench 108, whereby light extraction performance can be improved. Since a portion of the first trench 108 is formed so as to surround the periphery 111 of the light emission region, light which has been conventionally emitted from the side surfaces of the device is reflected onto the side of the n-type layer 106 by means of the side walls 108a of the first trench 108. Since, in general, light emitted from the side surfaces of the device is not effectively utilized, light extraction performance is substantially improved by forming a portion of the first trench 108 so as to surround the periphery 111 of the light emission region.

Next will be described processes for producing the light-emitting device 100 with reference to FIG. 4.

Figure 4A:
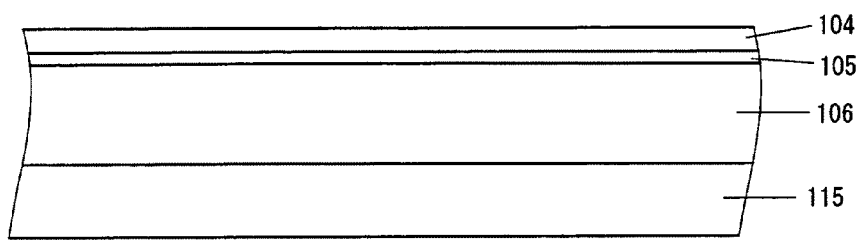
FIGS. 4A to 4H are sketches showing processes for producing the light-emitting device 100.

Firstly, an n-type layer 106, an active layer 105, and a p-type layer 104, which are formed of a Group III nitride semiconductor, are sequentially deposited on a sapphire substrate 115 through MOCVD (FIG. 4A). For MOCVD, the following raw material gases are employed: ammonia ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as an n-type doping gas; cyclopentadienylmagnesium ($Mg(C_5H_5)_2$) as a p-type doping gas; and $H_2$ and $N_2$ as carrier gases. The surface of the sapphire substrate 115 may be processed to have dents. The sapphire substrate 115 may be replaced with a substrate formed of, for example, SiC, ZnO, or spinel.

Figure 4B:
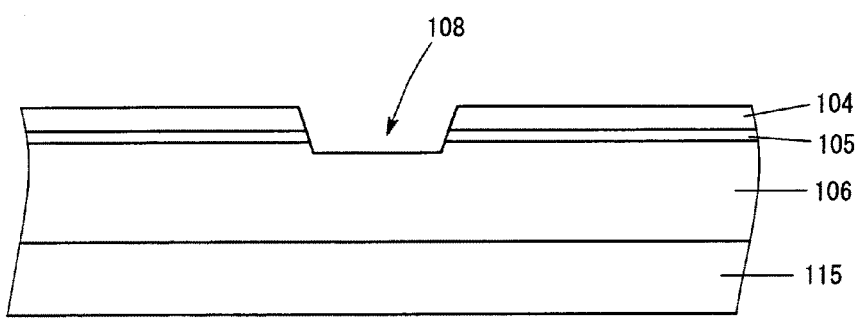

Subsequently, on the p-type layer 104 is formed an $SiO_2$ mask having a pattern with an opening corresponding to a region in which a first trench 108 is formed, followed by dry etching by use of a chlorine-containing gas plasma. This process forms a first trench 108 having almost the same pattern as an auxiliary electrode 109 and having a depth reaching the n-type layer 106. Thereafter, the mask is removed by use of, for example, buffered hydrofluoric acid (FIG. 4B).

Figure 4C:
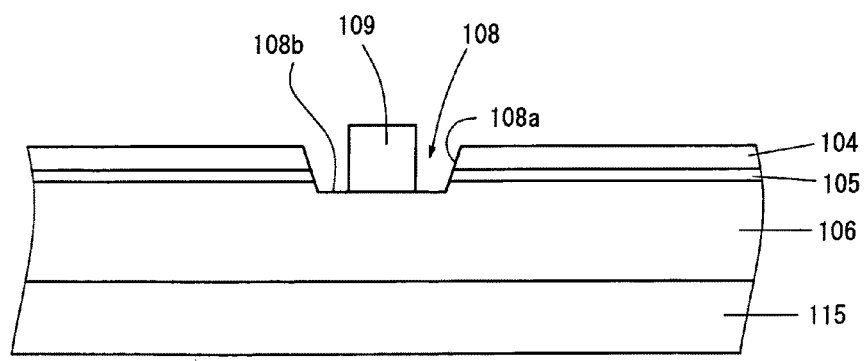

Then, an auxiliary electrode 109 is formed so that it comes into contact with the bottom 108b of the first trench 108, but does not come into contact with the side walls 108a of the first trench 108 (FIG. 4C). Alloying of the auxiliary electrode 109 may be carried out at any timing after formation of the auxiliary electrode 109. Only the auxiliary electrode 109 may be alloyed, or the auxiliary electrode 109 may be alloyed together with a p-electrode 103 which is formed later.

Figure 4D:
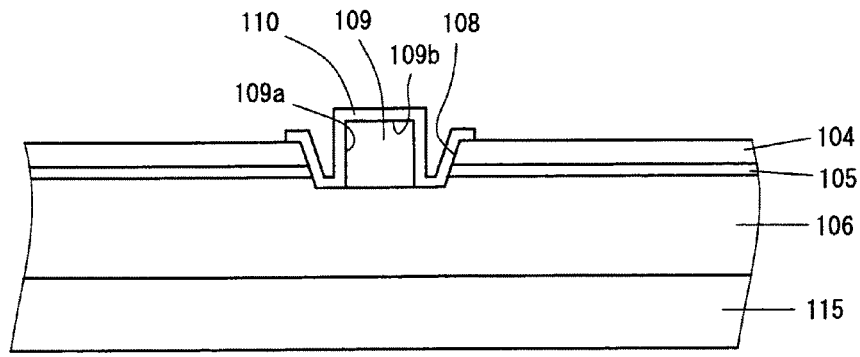

Subsequently, an insulating film 110 is continuously formed on the side walls 108a of the first trench 108, on a portion of the bottom 108b of the first trench 108 on which the auxiliary electrode 109 is not formed, on the side surfaces 109a of the auxiliary electrode 109, and on the top surface 109b of the auxiliary electrode 109, so that the insulating film 110 covers the auxiliary electrode 109 and the side walls 108a of the first trench 108 (FIG. 4D).

Figure 4E:
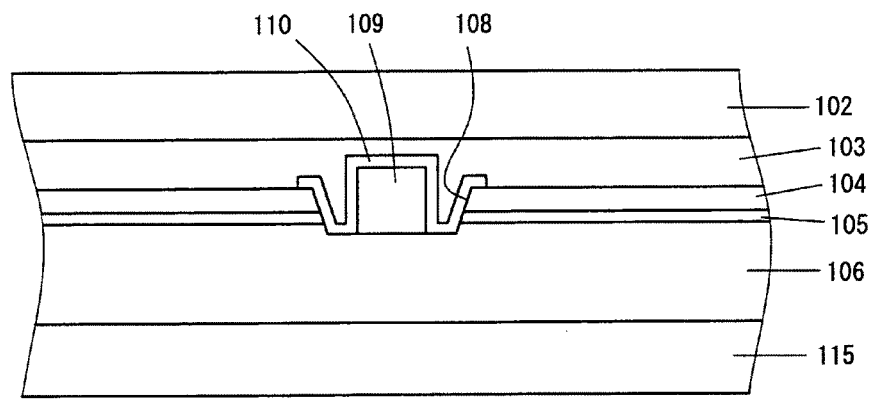

Next, a p-electrode 103 is formed on the p-type layer 104 and the insulating film 110 through sputtering, and a low-melting-point metal layer 102 is formed on the p-electrode 103 (FIG. 4E).

Figure 4F:
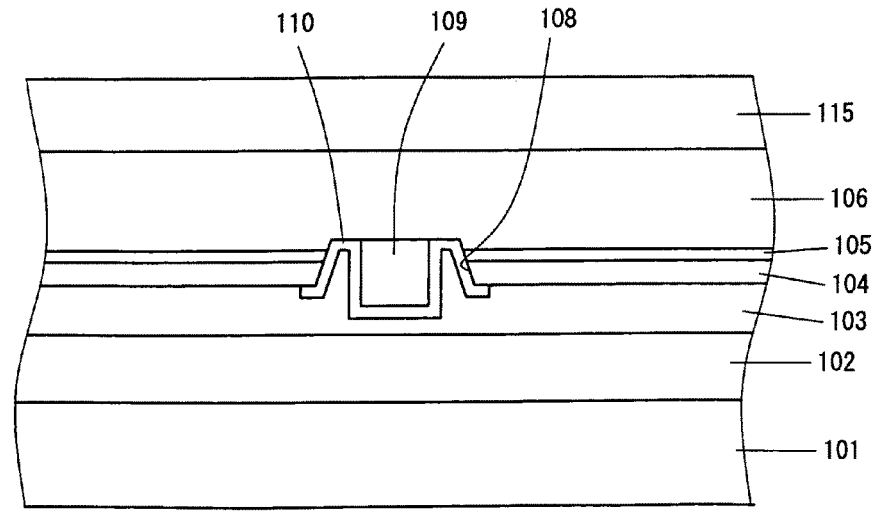

Then, a support 101 is provided, and the support 101 is bonded to the p-electrode 103 via the low-melting point metal layer 102 (FIG. 4F). A non-illustrated diffusion-preventing layer may be formed in advance between the p-electrode 103 and the low-melting-point metal layer 102, so as to prevent diffusion of the metal of the low-melting-point metal layer 102 toward the p-electrode 103.

Figure 4G:
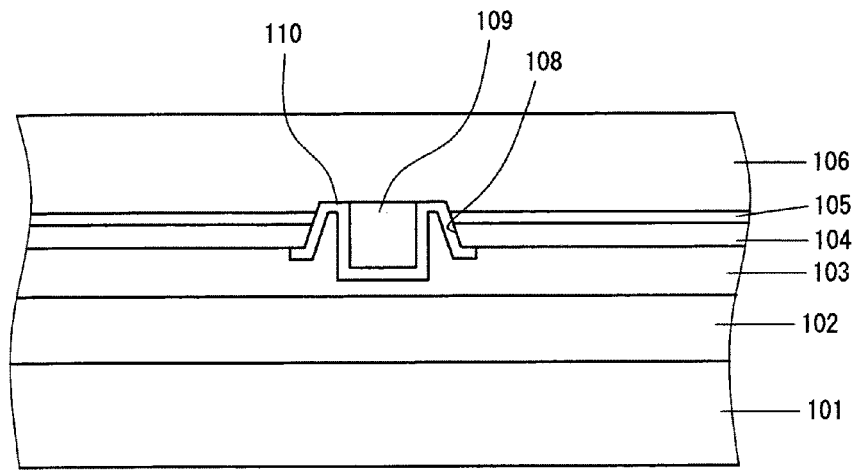

Subsequently, a laser beam is applied onto the side of the sapphire substrate 115, to thereby separate/remove the sapphire substrate 115 through the laser lift-off process (FIG. 4G).

Figure 4H:
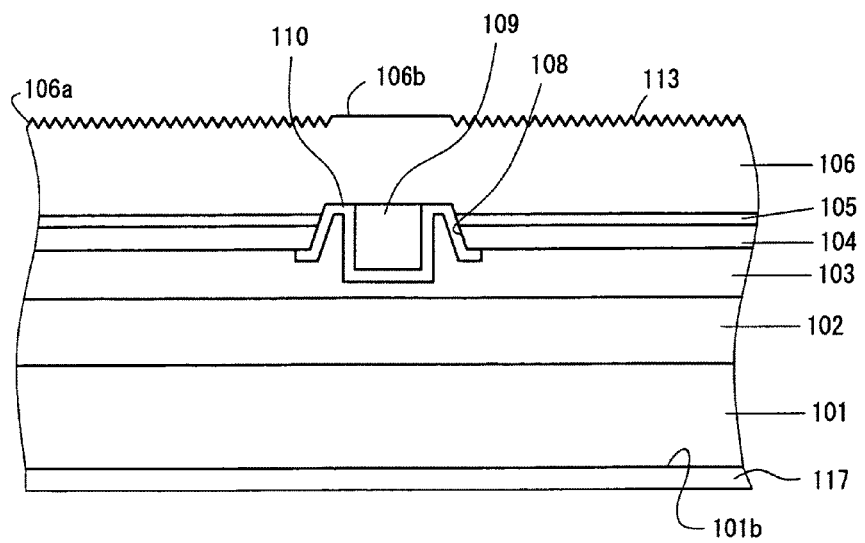

Next, an $SiO_2$ mask is formed on a region 106b (on which an n-electrode 107 is formed later) of the surface 106a of the n-type layer 106 exposed through removal of the sapphire substrate 115, and the resultant wafer is immersed in 22% aqueous TMAH (tetramethylammonium hydroxide) solution, to thereby form minute dents 113 on the unmasked region of the surface of the n-type layer 106. Thereafter, the mask is removed by use of buffered hydrofluoric acid (FIG. 4H). Thus, the minute dents 113 are formed on the entire surface 106a of the n-type layer 106, except for a region 106b on which an n-electrode 107 is formed; i.e., the n-electrode 107 formation region, which does not have the minute dents 113, remains flat. Formation of the minute dents 113 may be carried out by use of an aqueous solution of, for example, KOH or NaOH in place of TMAH.

Then, an n-electrode 107 is formed on the flat region 106b of the n-type layer 106 having no minute dent 113 through the lift-off process employing a resist. Subsequently, the support 101 is thinned through polishing, and a bottom electrode 117 is formed on the surface 101a of the support 101 on the side opposite the side of the low-melting-point metal layer 102, and the resultant wafer is separated into chips through laser dicing, to thereby produce the light-emitting device 100 shown in FIG. 1.

The pattern of the n-electrode or the auxiliary electrode is not limited to that described in Embodiment 1, and the n-electrode or the auxiliary electrode may have any pattern. However, preferably, the n-electrode or the auxiliary electrode has a symmetrical pattern, from the viewpoints of improvement of diffusion of current in directions parallel to the main surface of the device, as well as improvement of uniformity of emitted light. Preferably, a portion of the auxiliary electrode faces a portion or the entirety of the n-electrode in a direction perpendicular to the main surface of the device, and the facing region has a largest possible area. Preferably, a portion of the auxiliary electrode includes a wiring portion surrounding the periphery of the light emission region. Examples of patterns of the n-electrode and the auxiliary electrode will be described below.

Figure 5A:
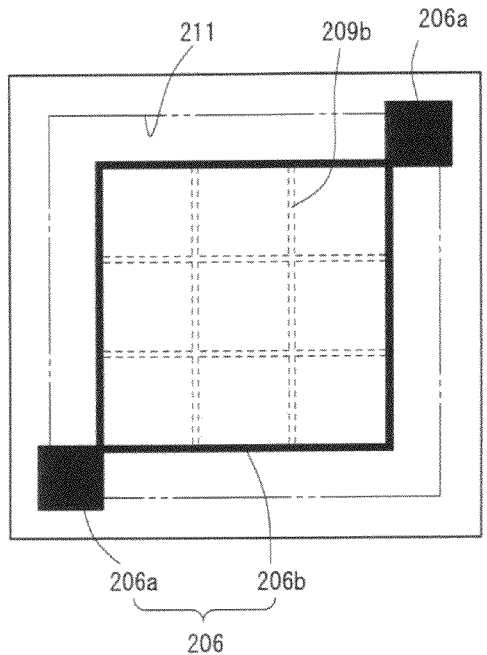
FIG. 5 shows patterns of another n-electrode and another auxiliary electrode.
Figure 5B:
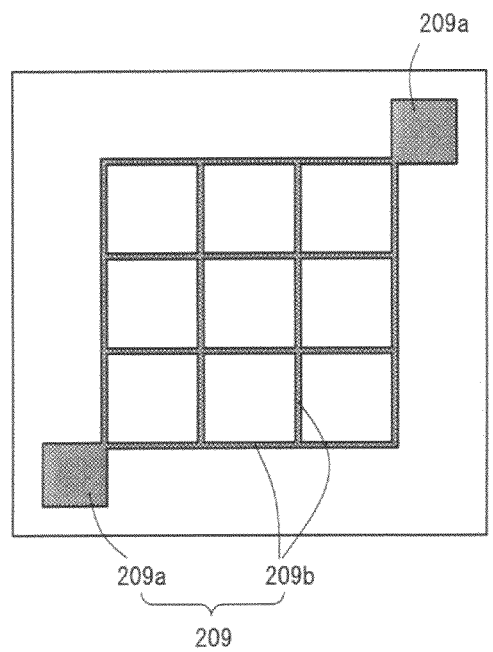

FIG. 5A shows the pattern of another n-electrode 206, and FIG. 5B shows the pattern of another auxiliary electrode 209. As shown in FIG. 5A, the n-electrode 206 includes two pad portions 206a provided at diagonal positions of a light-emitting device having a square form as viewed from above. Each of the pad portions 206a has a square form. The n-electrode 206 also includes a square wiring portion 206b which is connected to the pad portions 206a and is provided inside the periphery 211 of a light emission region. Meanwhile, the auxiliary electrode 209 includes two square portions 209a which have the same area and form as those of the pad portions 206a and are provided at positions facing the pad portions 206a in a direction perpendicular to the main surface of the device. The auxiliary electrode 209 also includes a grid-like portion 209b connected to the two square portions 209a. Each of the patterns of the n-electrode 206 and the auxiliary electrode 209 shown in FIGS. 5A and 5B is symmetric with respect to the diagonal lines of the square. The pad portions 206a of the n-electrode 206 face the square portions 209a of the auxiliary electrode 209, and the n-electrode 206 has an area smaller than that of the auxiliary electrode 209. Therefore, the light-emitting device exhibits improved light extraction performance without impairing uniformity of emitted light.

Figure 6A:
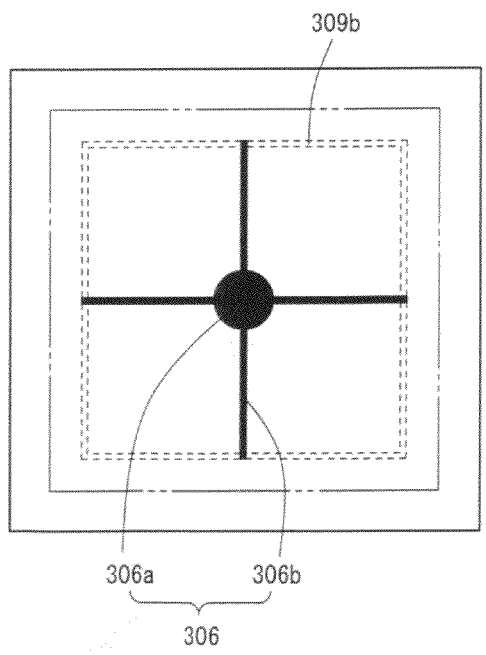
FIG. 6 shows patterns of another n-electrode and another auxiliary electrode.
Figure 6B:
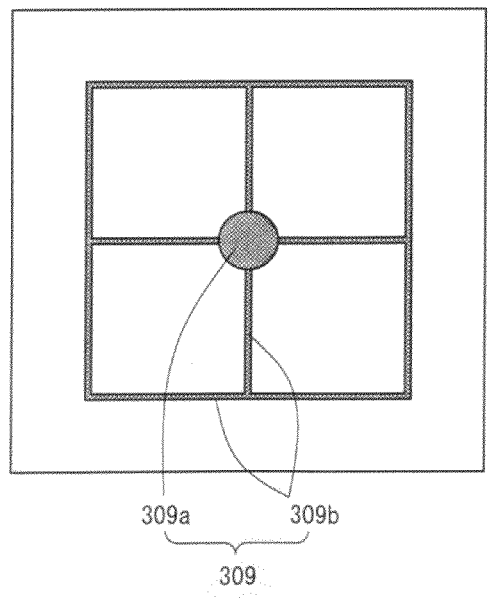

FIG. 6A shows the pattern of another n-electrode 306, and FIG. 6B shows the pattern of another auxiliary electrode 309. As shown in FIG. 6A, the n-electrode 306 includes a circular pad portion 306a provided at the center of a light-emitting device having a square form as viewed from above. The n-electrode 306 also includes a cross-shaped wiring portion 306b extending from the pad portion 306a. Meanwhile, the auxiliary electrode 309 includes a circular portion 309a which has the same area and form as those of the pad portion 306a and is provided at a position facing the pad portion 306a in a direction perpendicular to the main surface of the device. The auxiliary electrode 309 also includes a grid-like portion 309b connected to the circular portion 309a. The cross-shaped portion at the center of the grid-like portion 309b faces the wiring portion 306b of the n-electrode 306 in a direction perpendicular to the main surface of the device. Each of the patterns of the n-electrode 306 and the auxiliary electrode 309 shown in FIGS. 6A and 6B exhibits symmetry. The pad portion 306a of the n-electrode 306 faces the circular portion 309a of the auxiliary electrode 309, and the wiring portion 306b of the n-electrode 306 faces the cross-shaped portion of the grid-like portion 309b of the auxiliary electrode 309. The n-electrode 306 has an area smaller than that of the auxiliary electrode 309. Therefore, the light-emitting device exhibits improved light extraction performance without impairing uniformity of emitted light.

Figure 7A:
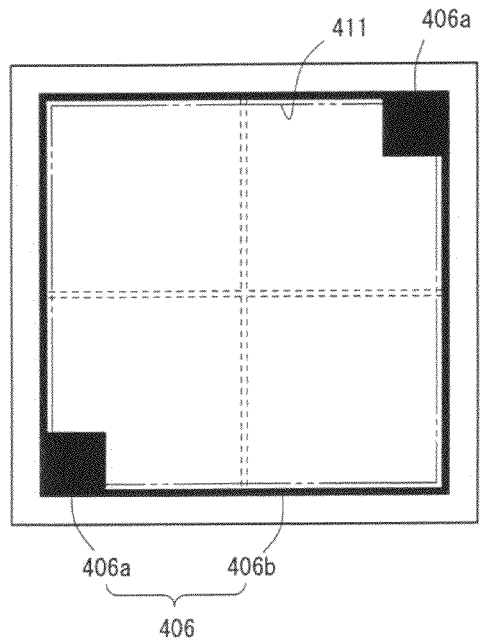
FIG. 7 shows patterns of another n-electrode and another auxiliary electrode.
Figure 7B:
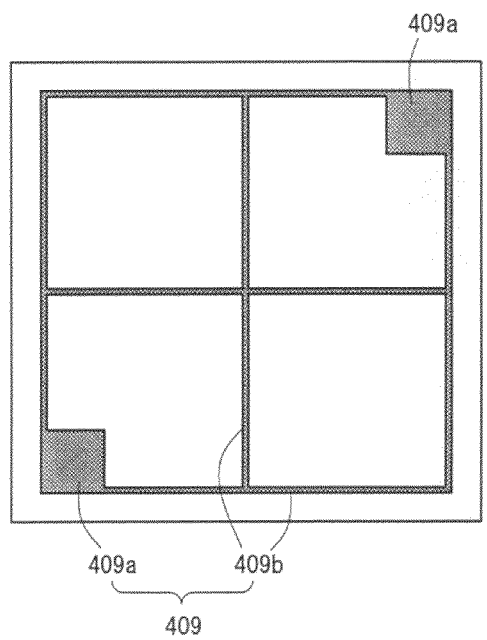

FIG. 7A shows the pattern of another n-electrode 406, and FIG. 7B shows the pattern of another auxiliary electrode 409. As shown in FIG. 7A, the n-electrode 406 includes two pad portions 406a provided at diagonal positions of a light-emitting device having a square form as viewed from above. Each of the pad portions 406a has a square form. The n-electrode 406 also includes a square wiring portion 406b which is connected to the pad portions 406a and is provided so as to surround the periphery 411 of a light emission region. Meanwhile, the auxiliary electrode 409 includes tetragonal portions 409a which have the same area and form as those of the two pad portions 406a and are provided at positions facing the pad portions 406a in a direction perpendicular to the main surface of the device. The auxiliary electrode 409 also includes a grid-like portion 409b which is connected to the tetragonal portions 409a and is provided so as to surround the periphery 411 of the light emission region. The peripheral portion of the grid-like portion 409b faces the wiring portion 406b of the n-electrode 406 in a direction perpendicular to the main surface of the device. Each of the patterns of the n-electrode 406 and the auxiliary electrode 409 shown in FIGS. 7A and 7B exhibits symmetry. The pad portions 406a of the n-electrode 406 face the square portions 409a of the auxiliary electrode 409, and the wiring portion 406b of the n-electrode 406 faces the peripheral portion of the grid-like portion 409b of the auxiliary electrode 409. The n-electrode 406 has an area smaller than that of the auxiliary electrode 409. Therefore, the light-emitting device exhibits improved light extraction performance without impairing uniformity of emitted light. Since the wiring portion 406b of the n-electrode 406 is provided at a position which is outside of the light emission region and surrounds the periphery 411 of the light emission region, the effect of the n-electrode 406 in inhibiting light extraction is low, as compared with the case where the electrode 406 is provided inside the periphery 411 of the light emission region; i.e., the light-emitting device exhibits improved light extraction performance.

Figure 8A:
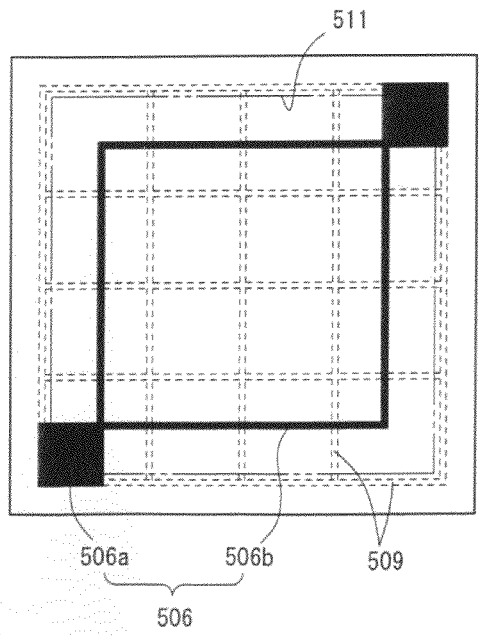
FIG. 8 shows patterns of another n-electrode and another auxiliary electrode.
Figure 8B:
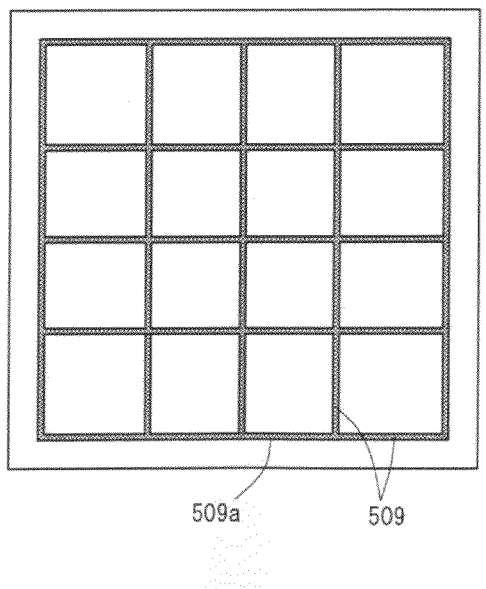

FIG. 8A shows the pattern of another n-electrode 506, and FIG. 8B shows the pattern of another auxiliary electrode 509. As shown in FIG. 8A, the n-electrode 506 includes two pad portions 506a provided at diagonal positions of a light-emitting device having a square form as viewed from above. Each of the pad portions 506a has a square form. The n-electrode 506 also includes a square wiring portion 506b which is connected to the pad portions 506a and is provided inside the periphery 511 of a light emission region. Meanwhile, the auxiliary electrode 509 has a grid-like pattern and includes a square wiring portion 509a surrounding the periphery 511 of the light emission region. A portion of the two pad portions 506a of the n-electrode 506 faces a portion of the wiring portion 509a of the auxiliary electrode 509 in a direction perpendicular to the main surface of the device. Each of the patterns of the n-electrode 506 and the auxiliary electrode 509 shown in FIGS. 8A and 8E exhibits symmetry, and the n-electrode 506 has an area smaller than that of the auxiliary electrode 509. Therefore, the light-emitting device exhibits improved light extraction performance without impairing uniformity of emitted light.

In this embodiment, a region of the n-type layer in which the n-electrode faces the auxiliary electrode may be etched on the top surface of the n-type layer, to thereby form a trench, and the n-electrode may be provided on the bottom of the trench. Since the thickness of the region of the n-type layer in which the n-electrode faces the auxiliary electrode is reduced, electrical conduction is more readily achieved between the n-electrode and the auxiliary electrode. Therefore, the area of the n-electrode can be reduced, and thus light extraction performance can be further improved.

In this embodiment, the sapphire substrate is removed through the laser lift-off process. However, the sapphire substrate may be removed through the chemical lift-off process; specifically, a buffer layer which can be dissolved in a chemical is formed between the sapphire substrate and the n-type layer, and, after bonding of the n-type layer to a support, the buffer layer is dissolved in a chemical for separation/removal of the sapphire substrate.

Embodiment 2

Figure 9:
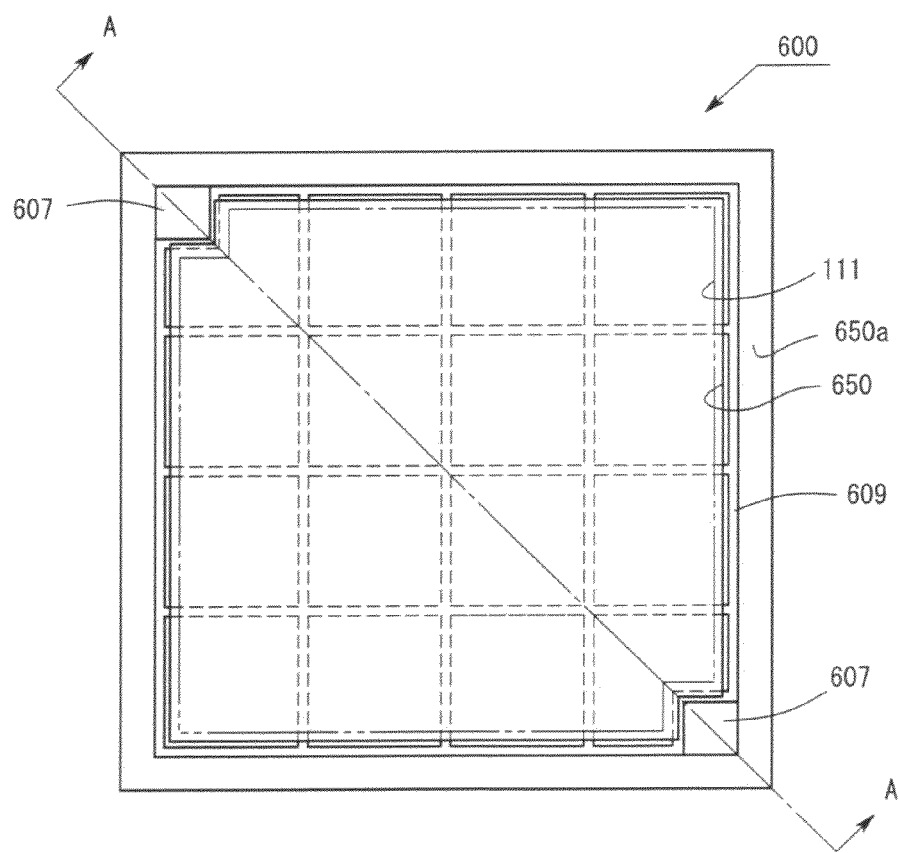
FIG. 9 is a plan view of a light-emitting device 600 according to Embodiment 2.
Figure 10:
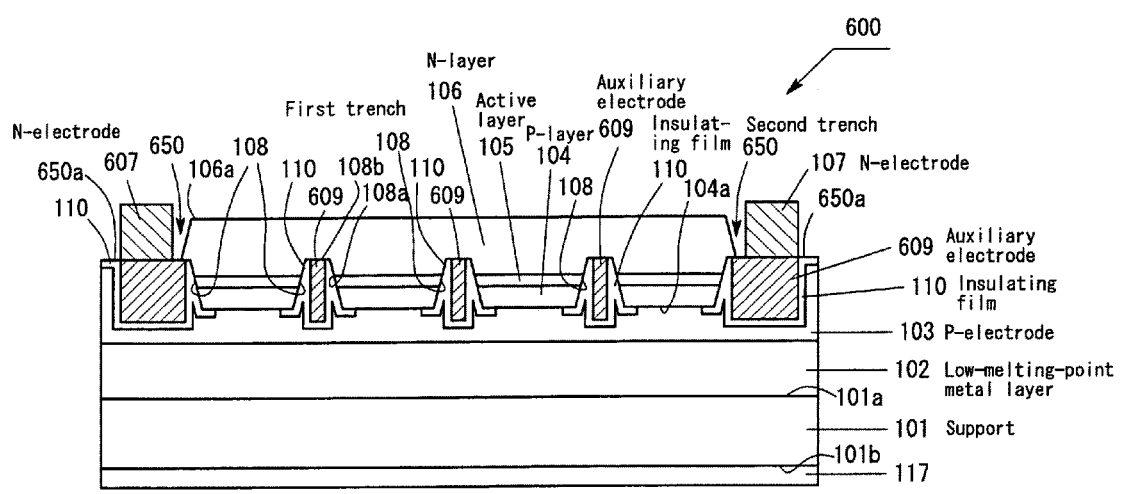
FIG. 10 is a cross-sectional view of the light-emitting device 600 of FIG. 9, as taken along line A-A.

In Embodiment 2, components having the same functions as those described in Embodiment 1 are denoted by the same reference numerals. FIG. 9 is a plan view of a light-emitting device 600 according to Embodiment 2, and FIG. 10 is a cross-sectional view of the device of FIG. 9, as taken along line A-A. As shown in FIG. 9, the light-emitting device 600 has a square form as viewed from above. As shown in FIG. 10, the light-emitting device 600 includes a support 101; a low-melting-point metal layer 102 formed on the support 101; a p-electrode 103 bonded to the support 101 via the low-melting-point metal layer 102; a p-type layer 104, an active layer 105, and an n-type layer 106, which are formed of a Group III nitride semiconductor and sequentially stacked on the p-electrode 103; an n-pad electrode 607; and an auxiliary electrode 609.

The support 101 may be an electrically conductive substrate formed of, for example, Si, GaAs, Cu, or Cu—W. A bottom electrode 117 is formed on the bottom surface 101b of the support 101 (i.e., the surface on the side opposite the side of the p-electrode 103) so that, in the light-emitting device 600, electrical conduction is achieved in a direction perpendicular to the main surface 101a of the device 600. The low-melting-point metal layer 102 may be a eutectic metal layer such as an Au—Sn layer, an Au—Si layer, an Ag—Sn—Cu layer, or an Sn—Bi layer. The low-melting-point metal layer 102 may be, for example, an Au layer, an Sn layer, or a Cu layer, although such a metal does not exhibit low melting point. Instead of bonding the p-electrode 103 to the support 101 via the low-melting-point metal layer 102, a metal layer (e.g., Cu layer) may be formed directly on the p-electrode 103 through, for example, plating or sputtering, and the metal layer may be employed as the support 101. The p-electrode 103 is formed of a metal exhibiting high optical reflectance and low contact resistance, such as Ag, Rh, Pt, Ru, or an alloy predominantly containing such a metal. Alternatively, the p-electrode 103 may be formed of, for example, Ni, an Ni alloy, or an Au alloy, or may be formed of a composite layer including a transparent electrode film (e.g., ITO film) and a high-reflectance metal film.

The p-type layer 104, the active layer 105, and the n-type layer 106 have the same configurations as those described in Embodiment 1.

A first trench 108 is formed on a surface 104a of the p-type layer 104, said surface 104a being closer to the p-electrode 103. The first trench 108 penetrates the p-type layer 104 and the active layer 105, and has a depth reaching the n-type layer 106. The side walls 108a of the first trench 108 are inclined such that the area of a horizontal cross section of the trench parallel to the main surface 101a of the device 600 is reduced with decreasing distance between the cross section and the n-type layer 106. The bottom 108b of the first trench 108 is parallel to the main surface 101a of the device 600.

Preferably, the side walls 108a of the first trench 108 are inclined by 30 to 85° (more preferably 40 to 80°) with respect to the main surface 101a of the device 600. This is because, when the angle between the side walls 108a and the main surface 101a of the device 600 falls within the above range, light extraction performance can be further improved.

The n-type layer 106 is exposed through the bottom 108b of the first trench 108, and an auxiliary electrode 609 is formed such that it is in contact with the bottom 108b of the first trench 108 (through which the n-type layer 106 is exposed), but is not in contact with the side walls 108a of the first trench 108. An $SiO_2$ insulating film 110 is continuously formed on the side walls 108a of the first trench 108, on a portion of the bottom 108b of the trench 108 on which the auxiliary electrode 609 is not formed, and on the auxiliary electrode 609. The insulating film 110 is provided for preventing short circuit between the side walls 108a of the trench 108 and the p-electrode 103, and between, the auxiliary electrode 609 and the p-type layer 104. The auxiliary electrode 609 may be formed of any material which has been conventionally used as a material of the n-electrode that is in contact with the +c-plane surface of the n-type layer of Group III nitride semiconductor. For example, the auxiliary electrode 609 may be formed of a material such as V/Al, Ti/Al, V/Au, Ti/Au, or Ni/Au.

No particular limitation is imposed on the material of the insulating film 110, so long as the material exhibits insulating property and permeability to light emitted from the light-emitting device 600. Examples of the material include, in addition to $SiO_2$, $Al_2O_3$, $Si_3N_4$, and $TiO_2$.

Gaps provided between the side walls 108a of the first trench 108 and the auxiliary electrode 609 via the insulating film 110 are filled with the p-electrode 103 formed of a highly reflective metal so that optical reflectance is enhanced at the side walls 108a of the trench 108, and light is more effectively reflected onto the side of the n-type layer 106. Instead of filling the gaps with the p-electrode 103, the side walls 108a of the trench 108 may be covered, via the insulating film 110, with a highly reflective metal film exhibiting good adhesion to the insulating film 110 (e.g., Al or Cr film) or with a dielectric multi-layer film formed of a plurality of dielectric materials having different refractive indices, to thereby improve light extraction performance. The insulating film 110 itself may be formed of a dielectric multi-layer film.

As shown in FIGS. 9 and 10, a second trench 650 is formed on the surface 106a of the n-type layer 106 on the side opposite the side of the active layer 105 and near the periphery 111 of the square light-emitting device 600 and at two corner portions provided at diagonal positions. The second trench 650 has such a depth that the auxiliary electrode 609 is exposed, and the auxiliary electrode 609 is exposed through the bottom 650a of the second trench 650 at the two corner portions provided at the diagonal positions. The second trench 650 is continued in a depth direction to the first trench 108 which exists under the second trench 650.

The n-electrode 607 includes two square pad portions, and, as shown in FIG. 9, the two pad portions are formed on the bottom 650a of the second trench 650 formed at the two corner portions provided at the diagonal positions of the square light-emitting device 600. The auxiliary electrode 609 exposed through the bottom 650a of the second trench 650 is connected directly to the n-electrode 607. Therefore, the n-electrode 607 may be formed of any material. The n-electrode 607 may be formed of the same material as the auxiliary electrode 609. Particularly preferably, the n-electrode 607 is formed of two or more layers, and the layer (among the two or more layers) which is in contact with the auxiliary electrode 609 is formed of a nitrogen-reactive material. In this case, strong adhesion is achieved between the n-electrode 607 and the auxiliary electrode 609. Examples of the nitrogen-reactive material include Ti, V, Zr, W, Ta, and Cr.

Figure 11:
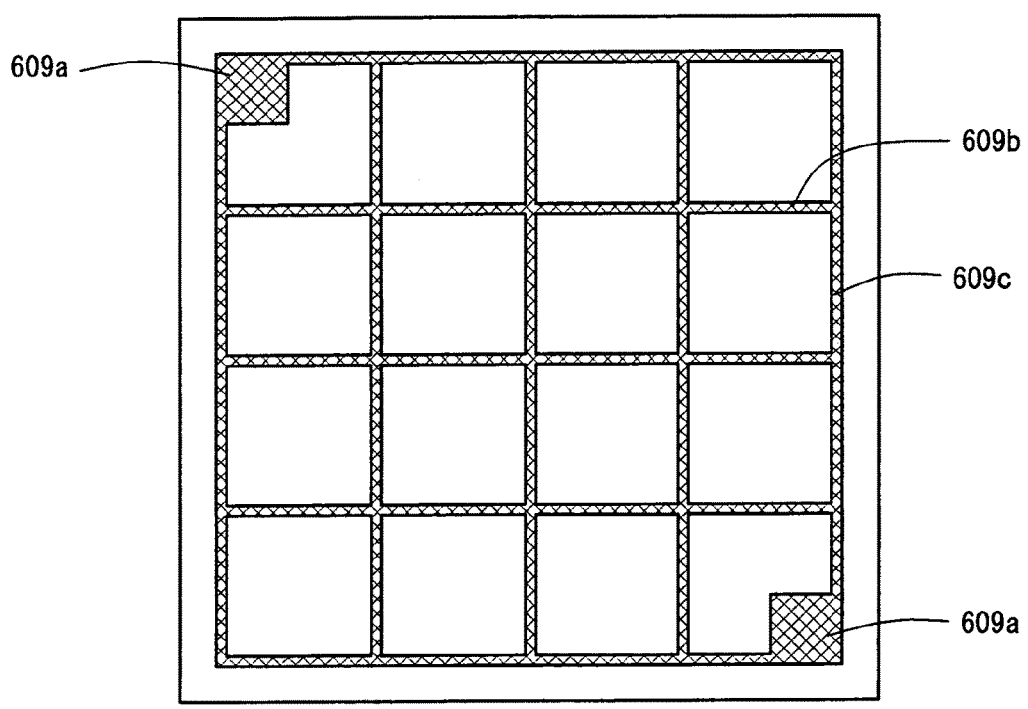
FIG. 11 shows a pattern of an auxiliary electrode 609.

FIG. 11 shows a plan-view pattern of the auxiliary electrode 609. The first trench 108 has a plan-view pattern similar to that of the auxiliary electrode 609. As shown in FIGS. 9 and 11, the auxiliary electrode 609 includes square portions 609a which are provided at positions facing the n-electrode 607 in a direction perpendicular to the main surface 101a of the device 600 (i.e., at two corners at diagonal positions of the square light-emitting device 600) and which have such a size that the n-electrode 607 is encompassed, as viewed from above, by the square portions. The auxiliary electrode 609 also includes a grid-like portion 609b which is connected to the square portions 609a and which is formed of wires parallel to sides of the square light-emitting device 600. The auxiliary electrode 609 also includes a square wiring portion 609c surrounding the periphery 111 of a light emission region of the light-emitting device 600. The periphery 111 of the light emission region corresponds to a portion represented by a two-dot chain line in FIG. 9, and the light emission region almost corresponds to a region in which the p-electrode 103 and the active layer 105 are formed.

As described above, the square portions 609a, which form the auxiliary electrode 609, are provided so that current smoothly flows from the auxiliary electrode 609 to the n-electrode 607. The wiring portion 609c, which forms the auxiliary electrode 609, is provided so as to exist outside of the light emission region and to surround the periphery 111 of the light emission region, for the following reasons. Since the wiring portion 609c is formed on the bottom of the first trench 108, naturally, a portion of the first trench 108 is also formed in a square wiring pattern so as to surround the periphery 111 of the light emission region. In the light-emitting device 600, light which has been conventionally emitted from the side surfaces of the device is reflected onto the side of the n-type layer 106 by means of the side walls 108a of the first trench 108 surrounding the periphery 111 of the light emission region. Since, in general, light emitted from the side surfaces of the device is not effectively utilized, the light-emitting device 600, in which emitted light is reflected onto the side of the n-type layer 106 by means of the wiring portion 609c, realizes substantial improvement of light extraction performance.

Preferably, minute dents are formed on the surface 106a of the n-type layer 106 on the side opposite the side of the active layer 105. Light extraction performance can be improved through formation of the minute dents. The minute dents may be provided through wet etching so that there are formed numerous micro hexagonal pyramids whose side surfaces are inclined by about 60° with respect to the main surface 101a of the device 600.

In the light-emitting device 600, the first trench 108 is formed so as to extend from the p-type layer 104 to the n-type layer 106, and the auxiliary electrode 609 is provided on the bottom 108b of the trench 108. The bottom 108b of the first trench 108 corresponds to the +c-plane surface of the n-type layer 106 of Group III nitride semiconductor, and the auxiliary electrode 609 can maintain sufficiently low resistance contact with the bottom 108a of the trench 108. In addition, a portion of the auxiliary electrode 609 is in direct contact with the n-electrode 607. Therefore, electrons supplied from the n-electrode 607 to the auxiliary electrode 609 can be widely diffused in directions parallel to the main surface 101a of the device 600 through the wiring-patterned auxiliary electrode 609, whereby uniformity of emitted light can be improved. Since a voltage drop decided by the sheet resistance of the n-type layer 106 is suppressed, driving voltage can be reduced. The n-electrode 607 is formed of only a pad portion and is provided on the auxiliary electrode 609; i.e., the n-electrode 607 is not located above the light emission region. Therefore, the n-electrode 607 does not inhibit light extraction, and thus light extraction performance is improved, as compared with the case of conventional light-emitting devices. Light which is propagated in a region in the vicinity of the active layer 105 (in directions parallel to the main surface 101a of the device 600) and which is confined in the device 600 is reflected at the interface between the p-electrode 103 and the insulating film 110 provided along the inclined side walls 108a of the first trench 108, and the thus-reflected light travels toward the n-type layer 106. Therefore, the amount of light emitted to the outside through the surface of the n-type layer 106 on the side opposite the side of the active layer 105 is increased, whereby light extraction performance is improved.

Next will be described processes for producing the light-emitting device 600 with reference to FIGS. 12A to 12I.

Figure 12A:
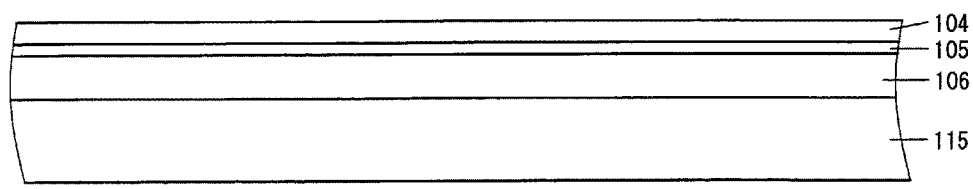
FIGS. 12A to 12I are sketches showing processes for producing the light-emitting device 600.

Firstly, an n-type layer 106, an active layer 105, and a p-type layer 104, which are formed of a Group III nitride semiconductor, are sequentially stacked on a sapphire substrate 115 through MOCVD (FIG. 12A). Since this process is carried out in a manner similar to that described in Embodiment 1, description thereof is omitted.

Figure 12B:
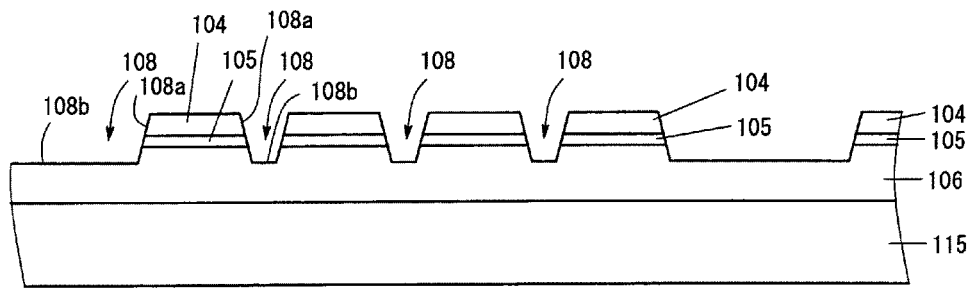

Subsequently, on the p-type layer 104 is formed an SiO₂ mask having a pattern with an opening corresponding to a region in which a first trench 108 is formed, followed by dry etching by use of a chlorine-containing gas plasma. This process forms a first trench 108 having almost the same pattern as an auxiliary electrode 609 and having a depth reaching the n-type layer 106. Thereafter, the mask is removed by use of, for example, buffered hydrofluoric acid (FIG. 12B).

Figure 12C:
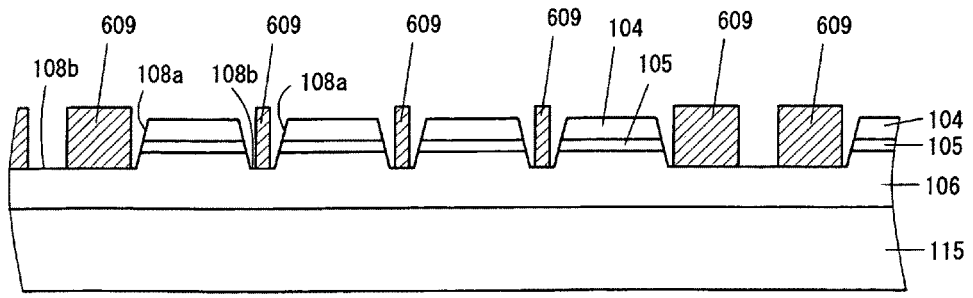

Then, an auxiliary electrode 609 is formed so that it comes into contact with the bottom 108b of the first trench 108, but does not come into contact with the side walls 108a of the first trench 108 (FIG. 12C). Alloying of the auxiliary electrode 609 may be carried out at any timing after formation of the auxiliary electrode 609. Only the auxiliary electrode 609 may be alloyed, or the auxiliary electrode 609 may be alloyed together with a p-electrode 103 which is formed later.

Figure 12D:
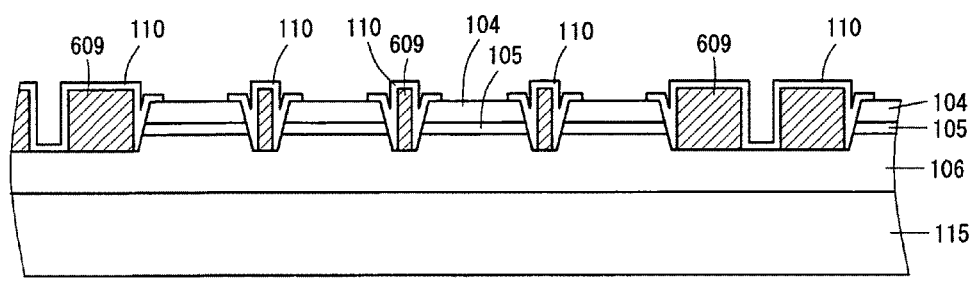

Subsequently, an insulating film 110 is continuously formed on the side walls 108a of the first trench 108, on a portion of the bottom 108b of the first trench 108 on which the auxiliary electrode 609 is not formed, on the side surfaces of the auxiliary electrode 609, and on the top surface of the auxiliary electrode 609, so that the insulating film 110 covers the auxiliary electrode 609 and the side walls 108a of the trench 108 (FIG. 12D). Junction surfaces are exposed at the side walls 108a of the first trench 108 through formation of the first trench 108, but, immediately thereafter, the exposed junction surfaces are protected by means of the insulating film 110. Thus, leakage of current can be reliably prevented.

Figure 12E:
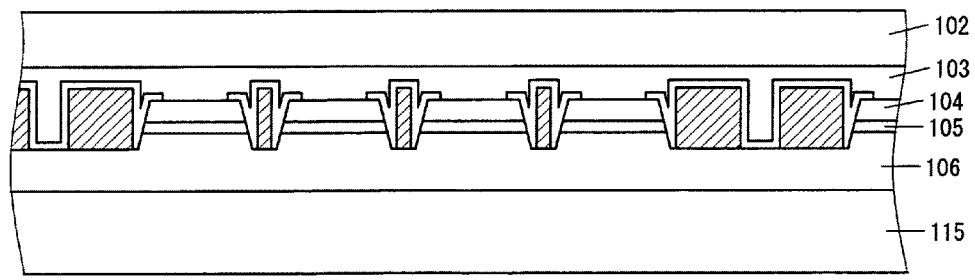
Figure 12F:
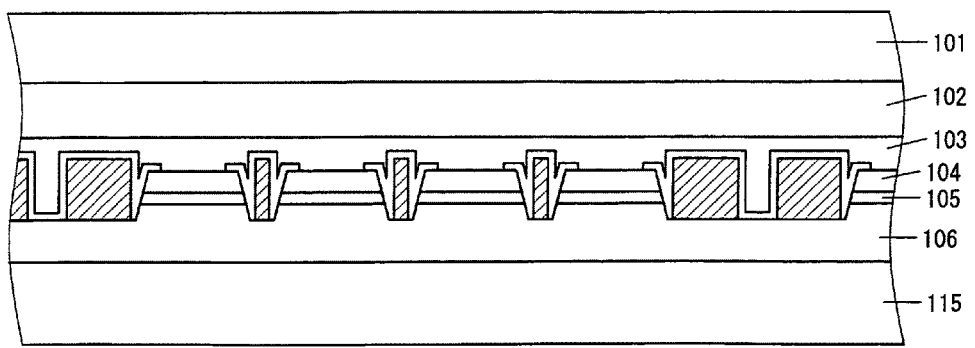
Figure 12G:
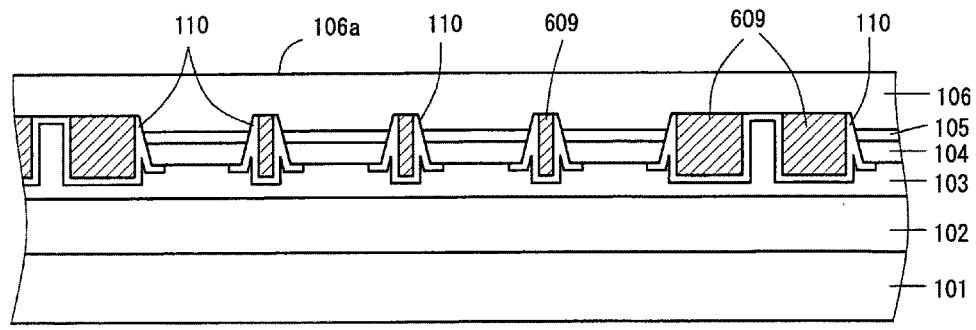

Next, a p-electrode 103 is formed on the p-type layer 104 and the insulating film 110 through sputtering, and a low-melting-point metal layer 102 is formed on the p-electrode 103 (FIG. 12E). Then, a support 101 is bonded to the p-electrode 103 via the low-melting-point metal layer 102 (FIG. 12F). Removal of the sapphire substrate 115 (FIG. 12G) is carried out in a manner similar to that described in Embodiment 1. Subsequently, the surface 106a of the n-type layer 106 exposed through removal of the sapphire substrate 115 is washed with hydrochloric acid. Since the surface 106a exposed through removal of the sapphire substrate 115 is the N-polar surface of the n-type layer 106, the insulating film 110 is not required to be formed for protecting junction surfaces after the laser lift-off process. However, the insulating film may be formed after the laser lift-off process for the purpose of preventing the surface from being contaminated or protecting the surface 106a from any physical damage.

Figure 12H:
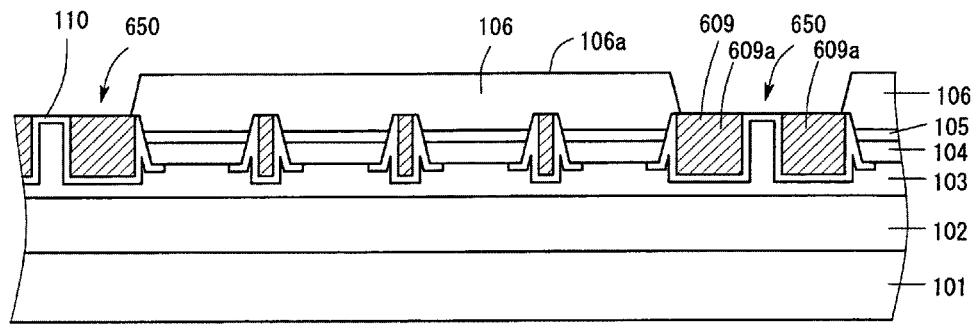

Subsequently, on the surface 106a of the n-type layer 106 exposed through removal of the sapphire substrate 115 is formed an SiO₂ mask having a pattern with an opening corresponding to a region in which a second trench 650 is formed, followed by dry etching by use of a chlorine-containing gas plasma. This process forms a second trench 650 having a depth reaching the auxiliary electrode 609. In this case, when a Pt layer, an Ni layer, or the like is provided in the auxiliary electrode 609, the Pt layer, the Ni layer, or the like functions as an etching stopper for forming the second trench 650. Thereafter, the mask is removed by use of, for example, buffered hydrofluoric acid (FIG. 12H).

Figure 12I:
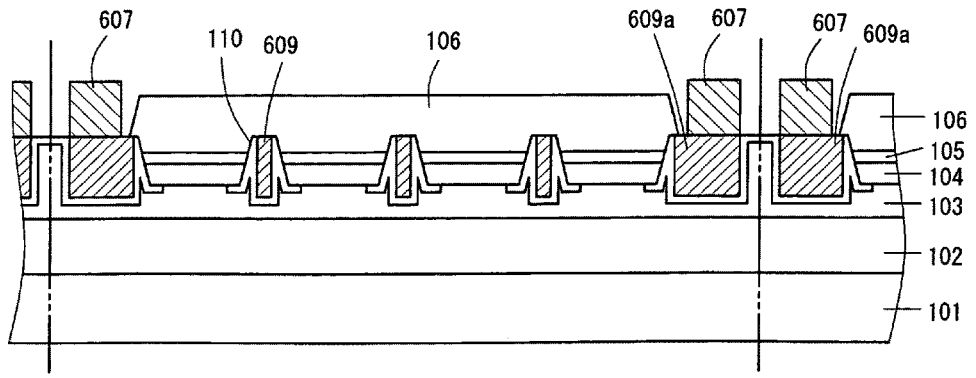

Then, an n-electrode 607 (i.e., square pad electrode) is formed, through the lift-off process, on a square portion 609a of the auxiliary electrode 609 exposed through formation of the second trench 650 (FIG. 12I). Subsequently, the support 101 is thinned through polishing, and a bottom electrode 117 is formed on the surface 101b of the support 101 on the side opposite the side of the low-melting-point metal layer 102, and the resultant wafer is separated into individual chips through laser dicing at device isolation portions (i.e., portions shown by dotted lines in FIG. 12I), to thereby produce the light-emitting device 600.

The pattern of the auxiliary electrode is not limited to that described in Embodiment 2, and the auxiliary electrode may have any pattern. No particular limitation is imposed on the number or arrangement pattern of pad portions of the n-electrode. However, preferably, the auxiliary electrode or the n-electrode has a symmetrical pattern, from the viewpoints of improvement of diffusion of current in directions parallel to the main surface of the device, as well as improvement of uniformity of emitted light. Preferably, the n-electrode has such a pattern that the n-electrode is encompassed by the auxiliary electrode as viewed from above, and the n-electrode is in contact with the auxiliary electrode over the largest possible area. Preferably, a portion of the auxiliary electrode includes a wiring portion surrounding the periphery of the light emission region. Other patterns of the n-electrode and the auxiliary electrode will be described below.

Figure 13:
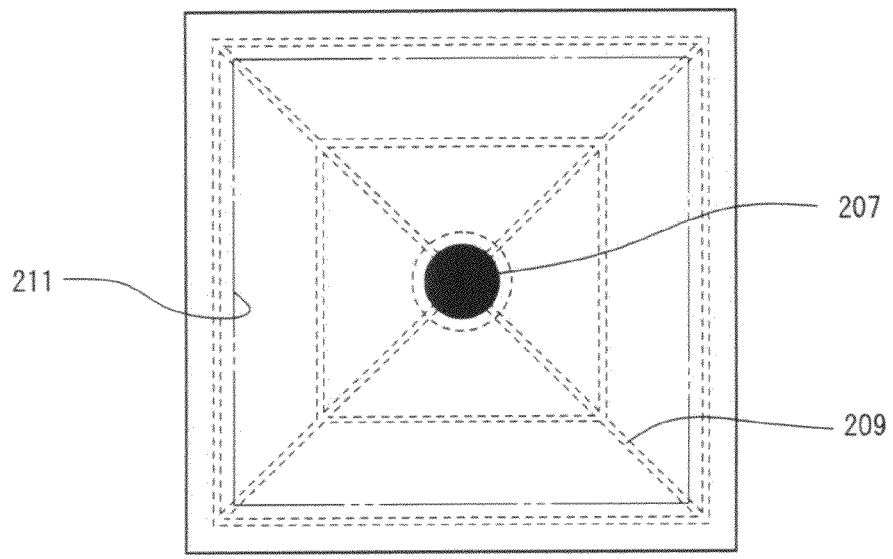
FIG. 13 shows a pattern of an n-electrode 207.
Figure 14:
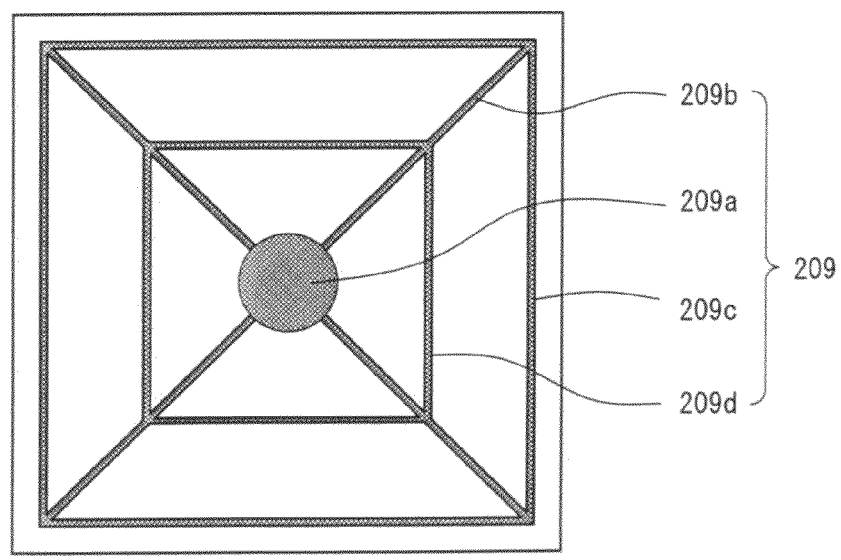
FIG. 14 shows a pattern of an auxiliary electrode 209.

FIG. 13 shows the pattern of another n-electrode 207, and FIG. 14 shows the pattern of another auxiliary electrode 209. As shown in FIG. 13, the n-electrode 207 includes one circular pad portion provided at the center of a light-emitting device having a square form as viewed from above. As shown in FIG. 14, the auxiliary electrode 209 includes a circular portion 209a which has a size slightly greater than that of the n-electrode 207 so as to encompass the n-electrode 207 as viewed from above, and which is provided at a position facing the n-electrode 207 in a direction perpendicular to the main surface of the device. The auxiliary electrode 209 also includes four wiring portions 209b extending from the circular portion 209a toward the vertices of the square. The auxiliary electrode 209 also includes a square wiring portion 209c surrounding the periphery 211 of a light emission region of the light-emitting device, and a square wiring portion 209d provided inside of the wiring portion 209c. Similar to the case of Embodiment 1, by virtue of the aforementioned patterns of the n-electrode 207 and the auxiliary electrode 209, the light-emitting device exhibits improved uniformity of emitted light and improved light extraction performance. Similar to the case of Embodiment 1, in Embodiment 2, the sapphire substrate may be removed through the chemical lift-off process.

Embodiment 3

Figure 15:
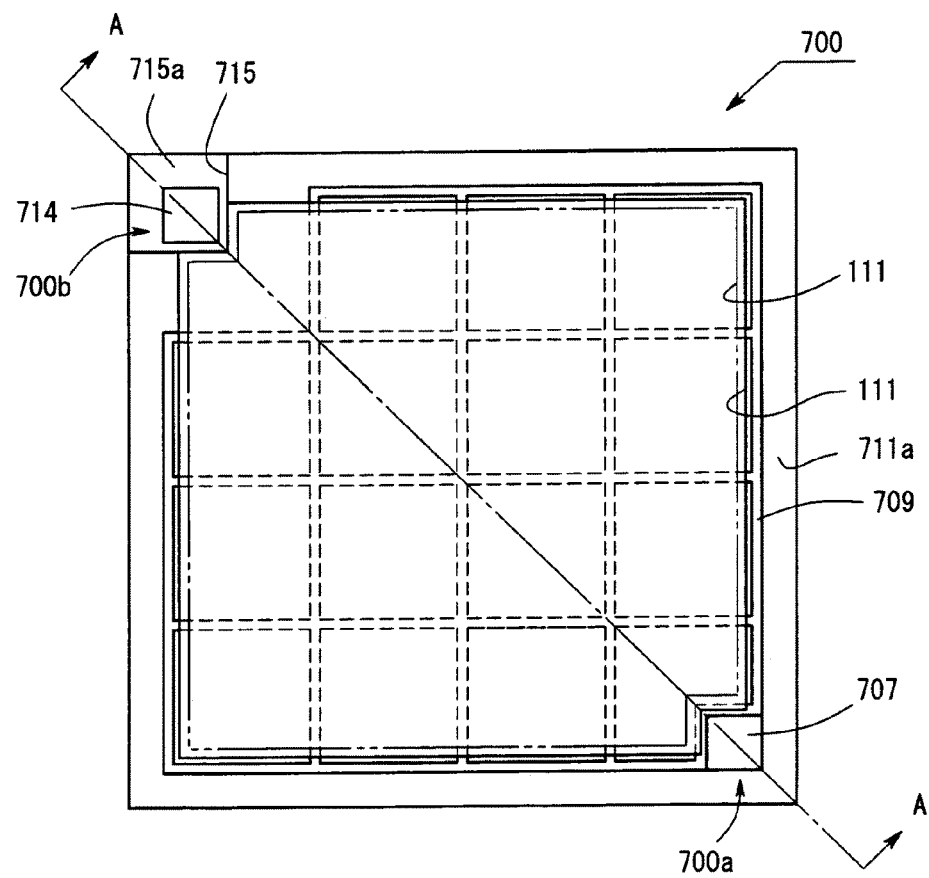
FIG. 15 is a plan view of a light-emitting device 700 according to Embodiment 3.
Figure 16:
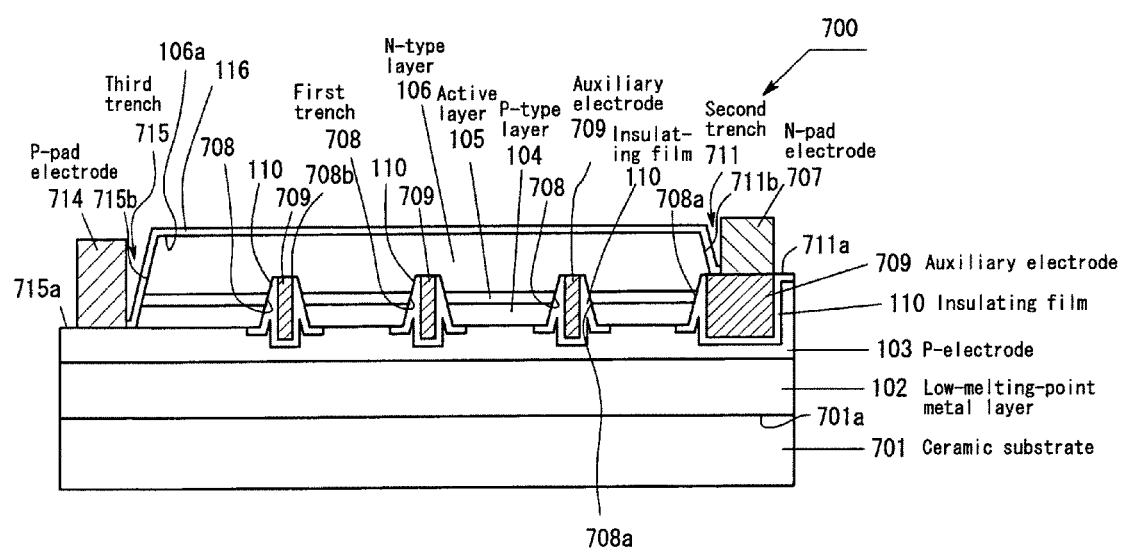
FIG. 16 is a cross-sectional view of the Light-emitting device 700 of FIG. 15, as taken along line A-A.

In Embodiment 3, components having the same functions as those described in Embodiment 1 or 2 are denoted by the same reference numerals. FIG. 15 is a plan view of a light-emitting device 700 according to Embodiment 3, and FIG. 16 is a cross-sectional view of the device of FIG. 15, as taken along line A-A. As shown in FIG. 16, the light-emitting device 700 includes a ceramic substrate 701; a low-melting-point metal layer 102 formed on the ceramic substrate 701; a p-electrode 103 bonded to the ceramic substrate 701 via the low-melting-point metal layer 102; a p-type layer 104, an active layer 105, and an n-type layer 106, which are formed of a Group III nitride semiconductor and sequentially stacked on the p-electrode 103; an n-pad electrode 707; an auxiliary electrode 709; and a p-pad electrode 714. As shown in FIG. 15, the light-emitting device 700 has a square form as viewed from above, and the n-pad electrode 707 and the p-pad electrode 714 are formed on the same surface.

The ceramic substrate 701 serves as a support and is formed of a material exhibiting high thermal conductivity and having a thermal expansion coefficient nearly equal to that of a Group III nitride semiconductor. Examples of such a material include AlN and SiC. The low-melting-point metal layer 102 may be a eutectic metal layer such as an Au—Sn layer, an Au—Si layer, an Ag—Sn—Cu layer, or an Sn—Bi layer. The low-melting-point metal layer 102 may be, for example, an Au layer, an Sn layer, or a Cu layer, although such a metal does not exhibit low melting point. The p-electrode 103 is formed of a metal exhibiting high optical reflectance and low contact resistance, such as Ag, Rh, Pt, Ru, or an alloy predominantly containing such a metal. Alternatively, the p-electrode 103 may be formed of, for example, Ni, an Ni alloy, or an Au alloy, or may be formed of a composite layer including a transparent electrode film (e.g., ITO film) and a high-reflectance metal film.

The p-type layer 104, the active layer 105, and the n-type layer 106 have the same configurations as those described in Embodiment 1 or 2. A first trench 708 is formed on a surface of the p-type layer 104, said surface being closer to the p-electrode 103. The first trench 708 penetrates the p-type layer 104 and the active layer 105, and has a depth reaching the n-type layer 106. The side walls of the first trench 708 are inclined such that the area of a horizontal cross section of the trench parallel to the main surface of the device is reduced with decreasing distance between the cross section and the n-type layer 106. The bottom of the first trench 708 is parallel to the main surface of the device.

Preferably, the side walls of the first trench 708 are inclined by 30 to 85° (more preferably 40 to 80°) with respect to the main surface of the device. This is because, when the angle between the side walls and the main surface of the device falls within the above range, light extraction performance can be further improved. The n-type layer 106 is exposed through the bottom of the first trench 708, and an auxiliary electrode 709 is formed such that it is in contact with the bottom of the first trench 708 (through which the n-type layer 106 is exposed), but is not in contact with the side walls of the first trench 708. An $SiO_2$ insulating film 110 is continuously formed on the side walls of the first trench 708, on a portion of the bottom of the first trench 708 on which the auxiliary electrode 709 is not formed, and on the auxiliary electrode 709. The insulating film 110 is provided for preventing short circuit between the side walls of the first trench 708 and the p-electrode 103, and between the auxiliary electrode 709 and the p-type layer 104. The auxiliary electrode 709 may be formed of any material which has been conventionally used as a material of the n-electrode that is in contact with the +c-plane surface of the n-type layer of Group III nitride semiconductor. For example, the auxiliary electrode 709 may be formed of a material such as V/Al, Ti/Al, V/Au, Ti/Au, or Ni/Au.

No particular limitation is imposed on the material of the insulating film 110, so long as the material exhibits insulating property and permeability to light emitted from the light-emitting device 700. Examples of the material include, in addition to $SiO_2$, $Al_2O_3$, $Si_3N_4$, and $TiO_2$.

Gaps provided between the side walls of the first trench 708 and the auxiliary electrode 709 via the insulating film 110 are filled with the p-electrode 103 formed of a highly reflective metal so that optical reflectance is enhanced at the side walls of the first trench 708, and light is more effectively reflected onto the side of the n-type layer 106. Instead of filling the gaps with the p-electrode 103, the side walls of the first trench 708 may be covered, via the insulating film 110, with a highly reflective metal film exhibiting good adhesion to the insulating film 110 (e.g., Al or Cr film) or with a dielectric multi-layer film formed of a plurality of dielectric materials having different refractive indices, to thereby improve light extraction performance. The insulating film 110 itself may be formed of a dielectric multi-layer film.

As shown in FIG. 15, a second trench 711 is formed on the surface of the n-type layer 106 on the side opposite the side of the active layer 105 and near the periphery 111 of the square light-emitting device 700 and at one corner portion 700a. The second trench 711 is not formed at a corner portion 700b provided at the position diagonal to the corner portion 700a. The second trench 711 has such a depth that the auxiliary electrode 709 is exposed, and the auxiliary electrode 709 is exposed through the bottom of the second trench 711 at the corner portion 700a.

As shown in FIG. 15, a third trench 715 is formed on the surface 106a of the n-type layer 106 on the side opposite the side of the active layer 105 and at the corner portion 700b at which the second trench 711 is not formed. As described below, the auxiliary electrode 709 is not formed at the corner portion 700b. The third trench 715 penetrates the n-type layer 106, the active layer 105, and the p-type layer 104, and has a depth reaching the p-electrode 103. The p-electrode 103 is exposed through the bottom 715a of the third trench 715.

As shown in FIG. 15, the n-pad electrode 707, which is formed of one square pad portion, is provided at the bottom 711a (also as shown in FIG. 16) of the second trench 711 formed at the corner portion 700a of the square light-emitting device 700. The auxiliary electrode 709 exposed through the bottom 711a of the second trench 711 is connected directly to the n-pad electrode 707. Therefore, the n-pad electrode 707 may be formed of any electrically conductive material. The n-pad electrode 707 may be formed of the same material as the auxiliary electrode 709. Particularly preferably, the n-pad electrode 707 is formed of two or more layers, and the layer (among the two or more layers) which is in contact with the auxiliary electrode 709 is formed of a nitrogen-reactive material. In this case, strong adhesion is achieved between the n-pad electrode 707 and the auxiliary electrode 709. Examples of the nitrogen-reactive material include Ti, V, Zr, W, Ta, and Cr.

As shown in FIG. 15, the p-pad electrode 714, which is formed of one square pad portion, is provided at the bottom 715a of the third trench 715 formed at the corner portion 700b located diagonal to the corner portion 700a of the square light-emitting device 700. The p-electrode 103 exposed through the bottom 715a of the third trench 715 is connected directly to the p-pad electrode 714. The p-pad electrode 714 may be formed of any material. Particularly preferably, the p-pad electrode 714 is formed of the same material as the n-pad electrode 707. In this case, the n-pad electrode 707 and the p-pad electrode 714 can be formed simultaneously, and thus the number of production processes can be reduced. Therefore, the cost required for the production of the light-emitting device 700 can be further reduced.

Through formation of the third trench 715, the p-type layer 104, the active layer 105, and the n-type layer 106 are exposed at the side walls 715b of the third trench 715. Therefore, a protective film 116 is continuously formed on the side walls 715b of the third trench 715, on the surface 106a of the n-type layer 106 (on the side opposite the side of the active layer 105), and on the side walls 711b of the second trench 711. The protective film 116 is provided for preventing leakage of current between the p-type layer 104 and the n-type layer 106 at the side walls 715b of the third trench 715, and for preventing any physical damage or contamination at the side walls 715b of the third trench 715, the surface 106a of the n-type layer 106, and the side walls 711b of the second trench 711. Similar to the case of the insulating film 110, no particular limitation is imposed on the material of the protective film 116, so long as the material exhibits insulating property and permeability to light emitted from the light-emitting device 700. Examples of the material include $SiO_2$, $Al_2O_3$, $Si_3N_4$, and $TiO_2$.

Figure 17:
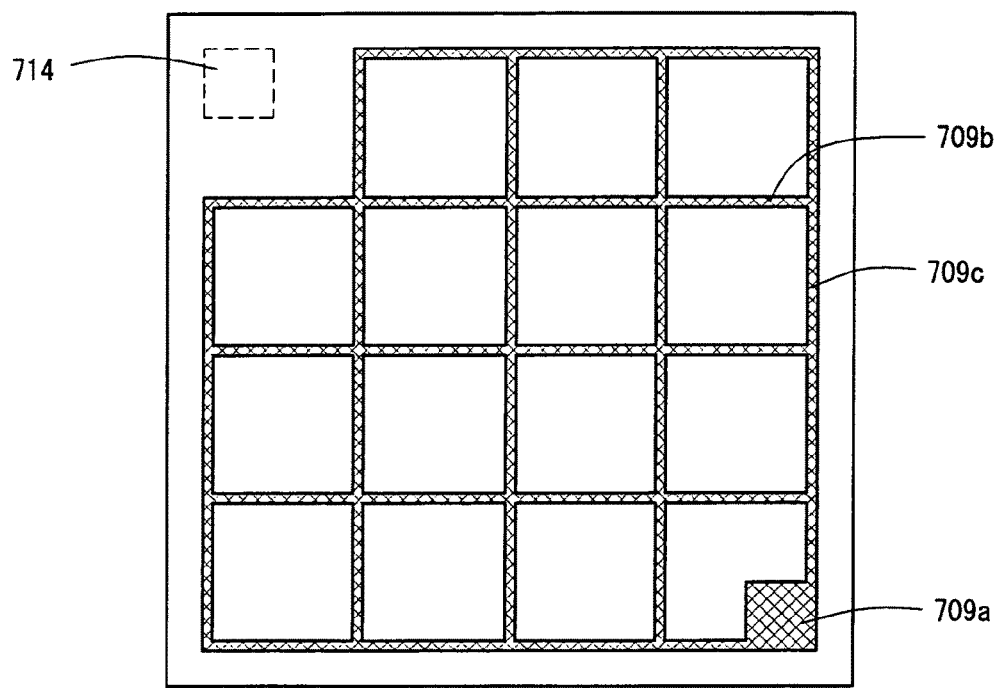
FIG. 17 shows a pattern of an auxiliary electrode 709.

FIG. 17 shows a plan-view pattern of the auxiliary electrode 709. The first trench 708 has a plan-view pattern similar to that of the auxiliary electrode 709. As shown in FIGS. 15 and 17, the auxiliary electrode 709 includes a square portion 709a which is provided at a position facing the n-pad electrode 707 in a direction perpendicular to the main surface 701a of the device 700 (i.e., at the corner portion 700a of the square light-emitting device 700) and which has such a size that the n-pad electrode 707 is encompassed, as viewed from above, by the square portion. The auxiliary electrode 709 also includes a grid-like portion 709b which is connected to the square portion 709a and which is formed of wires parallel to sides of the square light-emitting device 700. The auxiliary electrode 709 also includes a square wiring portion 709c surrounding the periphery 111 of a light emission region of the light-emitting device 700. The auxiliary electrode 709 is not provided in a region facing the p-pad electrode 714 in a direction perpendicular to the main surface 701a of the device 700 (i.e., at the corner portion 700b of the square light-emitting device 700 diagonal to the corner portion 700a at which the n-pad electrode 707 is provided). The periphery 111 of the light emission region corresponds to a portion represented by a two-dot chain line in FIG. 15, and the light emission region almost corresponds to a region in which the p-electrode 103 is in direct contact with the p-type layer 104, and the active layer 105 is formed.

As described above, the square portion 709a, which forms the auxiliary electrode 709, is provided so that current smoothly flows from the auxiliary electrode 709 to the n-pad electrode 707. The wiring portion 709c, which forms the auxiliary electrode 709, is provided so as to surround the periphery 111 of the light emission region, for the following reasons. Since the wiring portion 709c is formed on the bottom 708b of the first trench 708, naturally, a portion of the first trench 708 is also formed in a square wiring pattern so as to surround the periphery 111 of the light emission region. In the light-emitting device 700 according to Embodiment 3, light which has been conventionally emitted from the side surfaces of the device is reflected onto the side of the n-type layer 106 by means of the side walls 708a of the first trench 708 surrounding the periphery of the light emission region. Since, in general, light emitted from the side surfaces of the device is not effectively utilized, the light-emitting device 700, in which emitted light is reflected onto the side of the n-type layer 106 by means of the wiring portion 709c, realizes substantial improvement of light extraction performance.

Preferably, minute dents are formed on the surface 106a of the n-type layer 106 on the side opposite the side of the active layer 105. Light extraction performance can be improved through formation of the minute dents. The minute dents may be provided through wet etching so that there are formed numerous micro hexagonal pyramids whose side surfaces are inclined by about 60° with respect to the main surface of the device. Alternatively, a structure having minute dents having a size on the order of, or smaller than, the wavelength of emission may be formed on the surface 106a of the n-type layer 106 on the side opposite the side of the active layer 105 through dry etching after formation of a micro mask pattern.

In the light-emitting device 700, the first trench 708 is formed so as to extend from the p-type layer 104 to the n-type layer 106, and the auxiliary electrode 709 is provided on the bottom 708b of the first trench 708. The bottom 708b of the first trench 708 corresponds to the +c-plane surface of the n-type layer 106 of Group III nitride semiconductor, and the auxiliary electrode 709 can maintain sufficiently low resistance contact with the bottom 708b of the first trench 708. In addition, a portion of the auxiliary electrode 709 is in direct contact with the n-electrode 707. Therefore, electrons supplied from the n-electrode 707 to the auxiliary electrode 709 can be widely diffused in directions parallel to the main surface 701a of the device 700 through the wiring-patterned auxiliary electrode 709, whereby uniformity of emitted light can be improved. Since a voltage drop decided by the sheet resistance of the n-type layer 106 is suppressed, driving voltage can be reduced. The n-electrode is formed of only the n-pad electrode 707, and the n-pad electrode 707 is provided on the auxiliary electrode 709; i.e., the n-pad electrode 707 is not located above the light emission region. Therefore, the n-pad electrode 707 does not inhibit light extraction, and thus light extraction performance is improved, as compared with the case of conventional light-emitting devices. Light which is propagated in a region in the vicinity of the active layer 105 (in directions parallel to the main surface 701a of the device 700) and which is confined in the device 700 is reflected at the interface between the p-electrode 103 and the insulating film 110 provided along the inclined side walls 708a of the first trench 708, and the thus-reflected light travels toward the n-type layer 106. Therefore, the amount of light emitted to the outside through the surface 106a of the n-type layer 106 on the side opposite the side of the active layer 105 is increased, whereby light extraction performance is improved.

In addition, in the light-emitting device 700, the n-pad electrode 707 and the p-pad electrode 714 are provided on the same surface, and electrical conduction between these electrodes is not achieved in a direction perpendicular to the main surface 701a of the device 700. Therefore, a process for achieving electrical conduction to the ceramic substrate 701 (i.e., support) is not required, and thus the cost for production of the device can be reduced. Since the ceramic substrate 701 is formed of a material exhibiting high thermal conductivity and having a thermal expansion coefficient nearly equal to that of a Group III nitride semiconductor, heat is effectively radiated to the outside of the device, and linearity in a high-current region and durability upon long-term operation are improved.

Figure 18A:
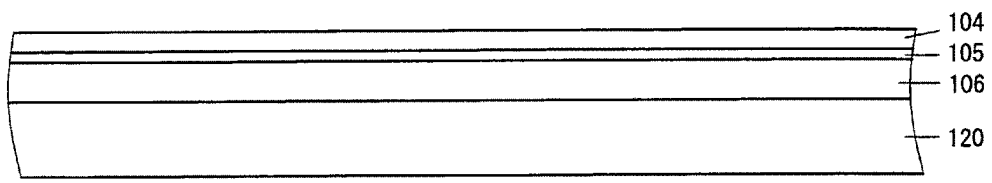
FIGS. 18A to 18I are sketches showing processes for producing the light-emitting device 700.

Next will be described processes for producing the light-emitting device 700 with reference to FIGS. 18A to 18I. Firstly, an n-type layer 106, an active layer 105, and a p-type layer 104, which are formed of a Group III nitride semiconductor, are sequentially stacked, via a buffer layer (not illustrated), on an Si substrate 120 having a (111)-plane main surface through MOCVD (FIG. 18A). The MOCVD growth process is carried out in a manner similar to that described in Embodiment 1 or 2.

Figure 18B:
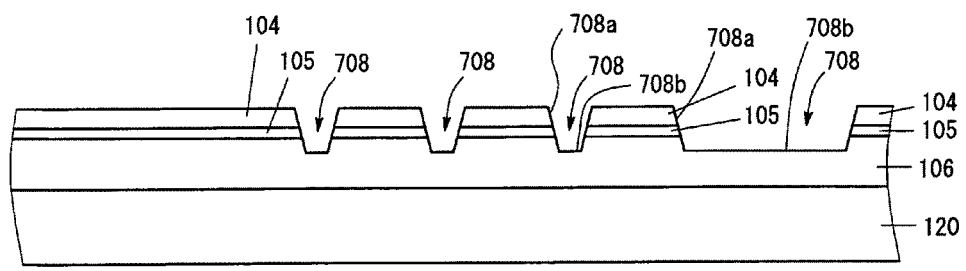
Figure 18C:
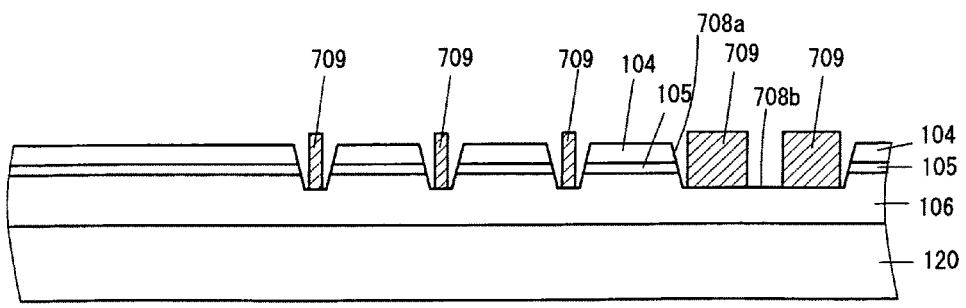

Subsequently, on the p-type layer 104 is formed an SiO$_2$ mask having a pattern with an opening corresponding to a region in which a first trench 708 is formed, followed by dry etching by use of a chlorine-containing gas plasma. This process forms a first trench 708 having almost the same pattern as an auxiliary electrode 709 and having a depth reaching the n-type layer 106. Thereafter, the mask is removed by use of, for example, buffered hydrofluoric acid (FIG. 18B). Then, an auxiliary electrode 709 is formed so that it comes into contact with the bottom 708b of the first trench 708, but does not come into contact with the side walls 708a of the first trench 708 (FIG. 18C). Alloying of the auxiliary electrode 709 may be carried out at any timing after formation of the auxiliary electrode 709. Only the auxiliary electrode 709 may be alloyed, or the auxiliary electrode 709 may be alloyed together with a p-electrode 103 which is formed later.

Figure 18D:
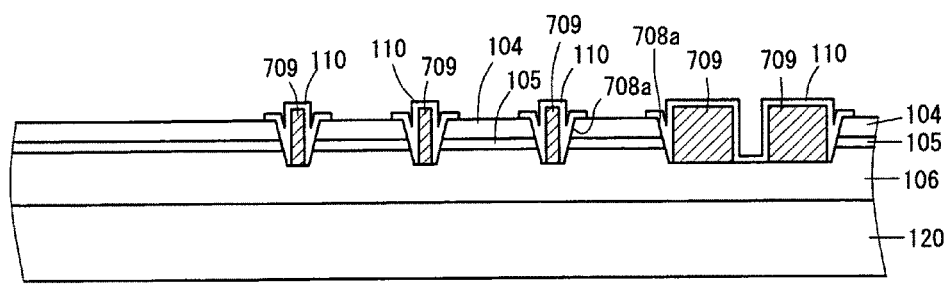

Subsequently, an insulating film 110 is continuously formed on the side walls 708a of the first trench 708, on a portion of the bottom 708b of the first trench 708 on which the auxiliary electrode 709 is not formed, on the side surfaces of the auxiliary electrode 709, and on the top surface of the auxiliary electrode 709, so that the insulating film 110 covers the auxiliary electrode 709 and the side walls 708a of the first trench 708 (FIG. 18D). Junction surfaces are exposed at the side walls 708a of the first trench 708 through formation of the first trench 708, but, immediately thereafter, the exposed junction surfaces are protected by means of the insulating film 110. Thus, leakage of current can be reliably prevented.

Figure 18E:
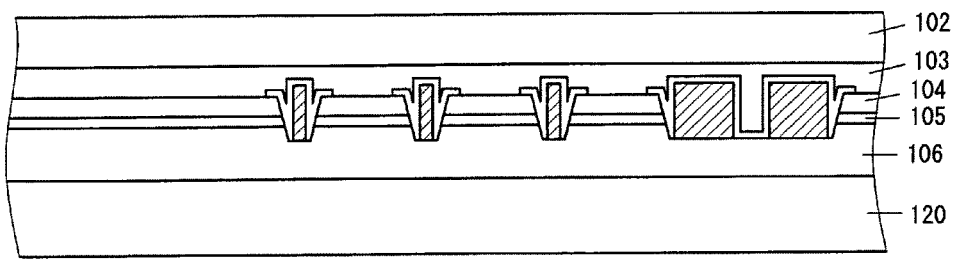
Figure 18F:
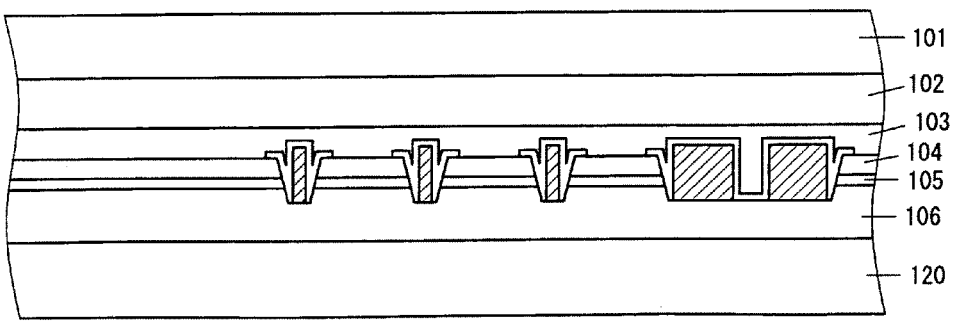

Next, a p-electrode 103 is formed on the p-type layer 104 and the insulating film 110 through sputtering, and a low-melting-point metal layer 102 is formed on the p-electrode 103 (FIG. 18E). Then, a ceramic substrate 701 is provided, and the ceramic substrate 701 is bonded to the p-electrode 103 via the low-melting-point metal layer 102 (FIG. 18F). A non-illustrated diffusion-preventing layer may be formed in advance between the p-electrode 103 and the low-melting-point metal layer 102, so as to prevent diffusion of the metal of the low-melting-point metal layer 102 toward the p-electrode 103.

Figure 18G:
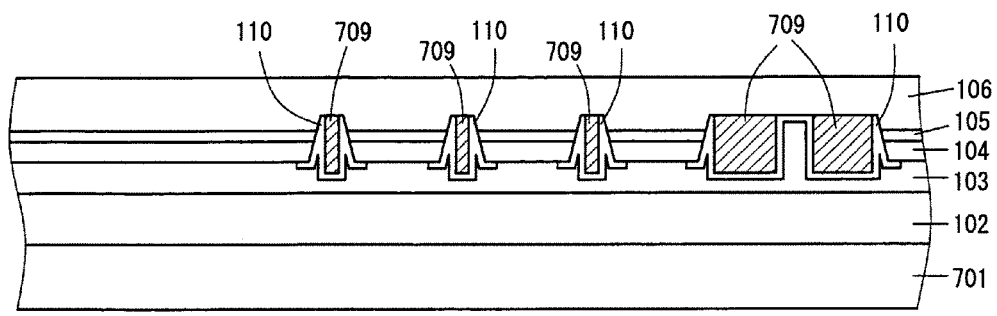

Subsequently, the Si substrate 120 is removed through wet etching by use of hydrofluoric acid (FIG. 18G). In this case, the ceramic substrate 701 (i.e., support) is also exposed to hydrofluoric acid. However, when the ceramic substrate 701 is formed of a material exhibiting resistance to hydrofluoric acid, only the Si substrate 120 can be removed.

Figure 18H:
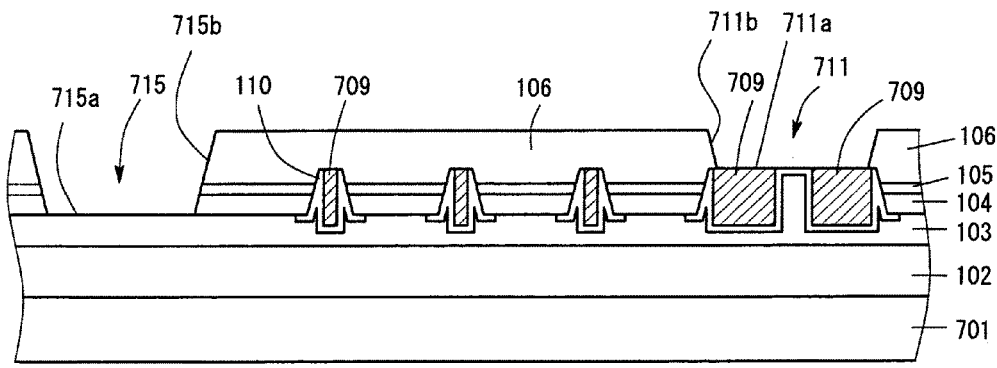

Then, on the surface 106a of the n-type layer 106 exposed through removal of the Si substrate 120 is formed an SiO$_2$ mask having a pattern with openings corresponding to regions in which a second trench 711 and a third trench 715 are formed, followed by dry etching by use of a chlorine-containing gas plasma. This process forms a second trench 711 having a depth reaching the auxiliary electrode 709, and a third trench 715 having a depth reaching the p-electrode 103. In this case, a layer capable of functioning as an etching stopper (e.g., a Pt layer or an Ni layer) may be provided in the auxiliary electrode 709 and the p-electrode 103, to thereby simultaneously form the second trench 711 and the third trench 715, which have different depths. Needless to say, the second trench 711 and the third trench 715 may be formed separately. Thereafter, the mask is removed by use of, for example, buffered hydrofluoric acid (FIG. 18H).

Figure 18I:
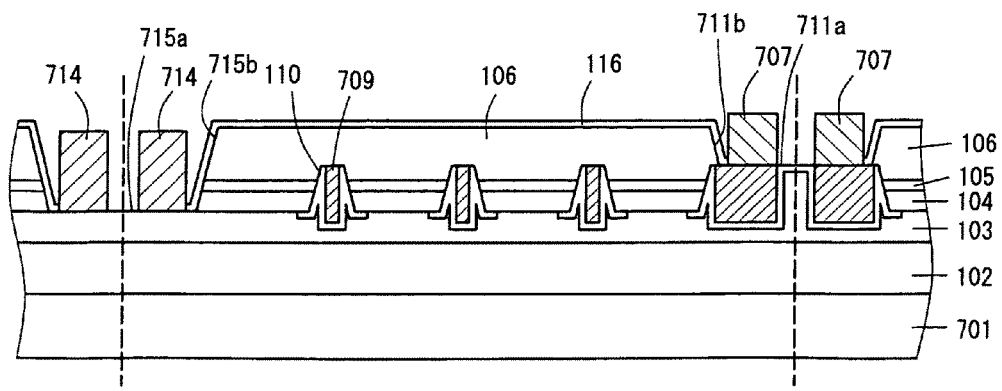

Next, a protective film 116 is formed on the side walls 715b of the third trench 715 for preventing leakage of current between the p-type layer 104 and the n-type layer 106 exposed at the side walls 715b of the third trench 715. Subsequently, an n-pad electrode 707 and a p-pad electrode 714 are simultaneously formed, through the lift-off process, on the auxiliary electrode 709 exposed through the bottom 711a of the second trench 711 and on the p-electrode 103 exposed through the bottom 715a of the third trench 715, respectively (FIG. 18I). Formation of the protective film 116 may be carried out after formation of the n-pad electrode 707 and the p-pad electrode 714. Thereafter, the resultant wafer is separated into individual chips at device isolation portions (i.e., portions shown by dotted lines in FIG. 18I), to thereby produce the light-emitting device 700.

In the aforementioned production processes for the light-emitting device 700, the Si substrate 120 is employed as a growth substrate for a Group III nitride semiconductor, and the Si substrate 120 is removed through wet etching instead of the laser lift-off process. Therefore, the light-emitting device 700 can be produced at low cost, as compared with the case of a conventional light-emitting device employing a sapphire substrate. This low-cost production is achieved by employing, as a support, the ceramic substrate 701, which is not corroded by a chemical that dissolves the Si substrate 120.

The pattern of the auxiliary electrode is not limited to that described in Embodiment 3, and the auxiliary electrode may have any pattern. No particular limitation is imposed on the form of the n-pad electrode or the p-pad electrode, or the number or arrangement pattern of pads. However, preferably, the n-pad electrode and the p-pad electrode are arranged in a symmetrical pattern, and the auxiliary electrode has a symmetrical pattern, from the viewpoints of improvement of diffusion of current in directions parallel to the main surface of the device, as well as improvement of uniformity of emitted light. Preferably, the n-pad electrode has such a pattern that the n-pad electrode is encompassed by the auxiliary electrode as viewed from above, and the n-pad electrode is in contact with the auxiliary electrode over the largest possible area. Preferably, a portion of the auxiliary electrode includes a wiring portion surrounding the periphery of the light emission region.

In Embodiment 3, the n-electrode may be formed on the n-type layer as shown in FIGS. 1 to 3 and at least one p-pad electrode may be disposed at any one diagonal position of the rectangular light emission region in FIG. 15.

In Embodiment 3, the n-pad electrode may be disposed at the center of the light emission region as shown in FIG. 13 and p-pad electrode may be disposed at one to four diagonal positions of the rectangular light emission region. The figure of the auxiliary electrode may be as shown in FIG. 14. Also one p-pad electrode may be disposed at any one of four diagonal positions of the rectangular light emission region and two or three n-pad electrodes may be disposed at two or three other diagonal positions of the rectangular light emission region in FIG. 15. Also two p-pad electrodes may be disposed at two diagonal positions of the rectangular light emission region and two n-pad electrodes may be disposed at two other diagonal positions of the rectangular light emission region in FIG. 15.

In the production processes for the light-emitting device according to Embodiment 3, the Si substrate is employed as a growth substrate for a Group III nitride semiconductor. However, similar to conventional cases, the light-emitting device may be produced through a method in which a sapphire substrate is employed as a growth substrate, and the sapphire substrate is removed through the laser lift-off process. In this case, the ceramic substrate (i.e., support) is not required to be subjected to any special treatment, and thus the light-emitting device can be produced at low cost, as compared with conventional cases.

The Group III nitride semiconductor light-emitting device of the present invention can be employed in, for example, an illumination apparatus or a display apparatus.

What is claimed is:

1. A Group III nitride semiconductor light-emitting device, comprising:
   a support;
   a p-electrode provided on the support;
   a p-type layer comprising a Group III nitride semiconductor and provided on the p-electrode;
   an active layer comprising a Group III nitride semiconductor and provided on the p-type layer;
   an n-type layer comprising a Group III nitride semiconductor and provided on the active layer;
   an n-electrode which is electrically connected to the n-type layer;
   a first trench having a depth extending from a lower surface of the p-type layer on a side of the p-electrode to reach the n-type layer;
   an auxiliary electrode which is in contact with a lower surface of the n-type layer at a bottom of the first trench, but is not in contact with side walls of the first trench;
   an insulating film which exhibits light permeability and is provided to cover the auxiliary electrode and the bottom and side walls of the first trench; and
   a second trench which is provided in a region facing a portion of the auxiliary electrode in a direction perpendicular to a main surface of the device, and which has a depth extending from an upper surface of the n-type layer on a side opposite the side of the p-electrode to the auxiliary electrode,
   wherein the n-electrode comprises only a pad portion and is provided on a portion of the auxiliary electrode exposed through the second trench.

2. A Group III nitride semiconductor light-emitting device according to claim 1, wherein the device further comprises:
   a third trench which is provided in a region not facing the auxiliary electrode in the direction perpendicular to the main surface of the device, and which has a depth extending from the upper surface of the n-type layer on the side opposite the side of the p-electrode to the p-electrode; and
   a p-pad electrode which is provided on a portion of the p-electrode exposed through the third trench.

3. A Group III nitride semiconductor light-emitting device according to claim 1, wherein a total area of the auxiliary electrode is greater than a total area of the n-electrode.

4. A Group III nitride semiconductor light-emitting device according to claim 1, wherein the first trench and the auxiliary electrode comprise a wiring pattern, respectively.

5. A Group III nitride semiconductor light-emitting device according to claim 1, wherein the side walls of the first trench are inclined such that an area of a horizontal cross section of the first trench parallel to the main surface of the device is reduced with decreasing distance between the horizontal cross section and the n-type layer.

6. A Group III nitride semiconductor light-emitting device according to claim 1, wherein the first trench and the auxiliary electrode comprise a surrounding wiring pattern which surrounds a periphery of a light emission region, respectively.

7. A Group III nitride semiconductor light-emitting device according to claim 1, wherein the auxiliary electrode comprises V/Al, Ti/Al, V/Au, Ti/Au, or Ni/Au.

8. A Group III nitride semiconductor light-emitting device according to claim 1, wherein, as viewed from above, the auxiliary electrode encompasses the n-electrode.

9. A Group III nitride semiconductor light-emitting device according to claim 1, wherein the light-emitting device has a rectangular form, and
   wherein two pad portions are provided at diagonal positions of the light-emitting device having the rectangular form.

10. A Group III nitride semiconductor light-emitting device according to claim 2, wherein the light-emitting device has a rectangular form, and
    wherein two pad portions are provided at diagonal positions of the light-emitting device having the rectangular form.

11. A Group III nitride semiconductor light-emitting device according to claim 2, wherein the light-emitting device has a rectangular form, and
    wherein the n-electrode and the p-pad electrode are disposed at diagonal positions of the light-emitting device having the rectangular form.

12. Group III nitride semiconductor light-emitting device according to claim 2, wherein the support comprises a ceramic substrate.

13. A Group III nitride semiconductor light-emitting device according to claim 6, wherein the first trench and the auxiliary electrode comprise a grid-like wiring pattern.

14. A Group III nitride semiconductor light-emitting device according to claim 13, wherein the light-emitting device has a rectangular form, and
    wherein two pad portions are provided at diagonal positions of the light-emitting device having the rectangular form.

15. A Group III nitride semiconductor light-emitting device according to claim 14, wherein the support comprises an electrically conductive substrate and a current is supplied to the p-electrode through the electrically conductive substrate.

16. A Group III nitride semiconductor light-emitting device according to claim 1, further comprising gaps between the insulating film on side walls of the auxiliary electrode and the insulating film on the side walls of the first trench, the gaps being filled with the p-electrode.

17. A Group III nitride semiconductor light-emitting device according to claim 2, further comprising gaps between the insulating film on side walls of the auxiliary electrode and the insulating film on the side walls of the first trench, the gaps being filled with the p-electrode.

18. A Group III nitride semiconductor light-emitting device according to claim 13, further comprising gaps between the insulating film on side walls of the auxiliary electrode and the insulating film on the side walls of the first trench, the gaps being filled with the p-electrode.

* * * * *